(12) United States Patent
Buot et al.

(10) Patent No.: US 11,562,962 B2
(45) Date of Patent: Jan. 24, 2023

(54) PACKAGE COMPRISING A SUBSTRATE AND INTERCONNECT DEVICE CONFIGURED FOR DIAGONAL ROUTING

(71) Applicant: QUALCOMM Incorporated, San Diego, CA (US)

(72) Inventors: Joan Rey Villarba Buot, Escondido, CA (US); Aniket Patil, San Diego, CA (US); Zhijie Wang, San Diego, CA (US); Hong Bok We, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 88 days.

(21) Appl. No.: 17/148,367

(22) Filed: Jan. 13, 2021

(65) Prior Publication Data
US 2022/0223529 A1 Jul. 14, 2022

(51) Int. Cl.
*H01L 23/538* (2006.01)
*H01L 21/48* (2006.01)
(Continued)

(52) U.S. Cl.
CPC ...... *H01L 23/5381* (2013.01); *H01L 21/4853* (2013.01); *H01L 21/4857* (2013.01); *H01L 23/5383* (2013.01); *H01L 23/5385* (2013.01); *H01L 23/5386* (2013.01); *H01L 24/16* (2013.01); *H01L 21/4882* (2013.01); *H01L 23/3675* (2013.01); *H01L 23/49822* (2013.01); *H01L 25/0655* (2013.01); *H01L 25/16* (2013.01); *H01L 25/167* (2013.01);
(Continued)

(58) Field of Classification Search
CPC ............ H01L 23/5381; H01L 21/4853; H01L 21/4857; H01L 23/5383; H01L 23/5385; H01L 23/5386; H01L 24/16; H01L 21/4882; H01L 23/3675; H01L 23/49822; H01L 25/0655; H01L 25/16; H01L 25/167; H01L 25/18; H01L 2224/16227; H01L 2224/17133; H01L 2224/17135
See application file for complete search history.

(56) References Cited

U.S. PATENT DOCUMENTS

2005/0240893 A1* 10/2005 Teig .................. G06F 30/394
257/773
2019/0131268 A1* 5/2019 Hossain ............ G06F 13/4265
(Continued)

OTHER PUBLICATIONS

International Search Report and Written Opinion—PCT/US2021/062237—ISA/EPO—dated Mar. 30, 2022.

*Primary Examiner* — Selim U Ahmed
*Assistant Examiner* — Evan G Clinton
(74) *Attorney, Agent, or Firm* — Loza & Loza, LLP

(57) ABSTRACT

A package comprising a substrate comprising a plurality of interconnects, a first integrated device coupled to the substrate, a second integrated device coupled to the substrate, and an interconnect device coupled to the substrate. The first integrated device, the second integrated device, the interconnect device and the substrate are configured to provide an electrical path for an electrical signal between the first integrated device and the second integrated device, that extends through at least the substrate, through the interconnect device and back through the substrate. The electrical path includes at least one interconnect that extends diagonally.

25 Claims, 20 Drawing Sheets

PROFILE VIEW

(51) Int. Cl.
  *H01L 23/00*    (2006.01)
  *H01L 23/367*    (2006.01)
  *H01L 23/498*    (2006.01)
  *H01L 25/065*    (2006.01)
  *H01L 25/16*    (2006.01)
  *H01L 25/18*    (2006.01)

(52) U.S. Cl.
  CPC .... *H01L 25/18* (2013.01); *H01L 2224/16227* (2013.01); *H01L 2224/17133* (2013.01); *H01L 2224/17135* (2013.01)

(56) References Cited

U.S. PATENT DOCUMENTS

2019/0206798 A1  7/2019  Collins et al.
2020/0098692 A1* 3/2020  Lift .................... H01L 23/5386
2020/0357744 A1* 11/2020 Yong .................. H01L 23/3185
2020/0365515 A1  11/2020 Su et al.
2021/0305132 A1* 9/2021  Karhade ............ H01L 25/0652

\* cited by examiner

PLAN VIEW

PROFILE VIEW

PROFILE VIEW

PROFILE VIEW

PROFILE VIEW

PROFILE VIEW

PACKAGE COMPRISING A SUBSTRATE AND INTERCONNECT DEVICE CONFIGURED FOR DIAGONAL ROUTING

FIELD

Various features relate to packages that include an integrated device, but more specifically to a package that includes an integrated device and a substrate.

BACKGROUND

FIG. 1 illustrates a package 100 that includes a substrate 102, an integrated device 104, and an integrated device 106. The substrate 102 includes at least one dielectric layer 120, a plurality of interconnects 122, and a plurality of solder interconnects 124. A plurality of solder interconnects 144 is coupled to the substrate 102 and the integrated device 104. A plurality of solder interconnects 164 is coupled to the substrate 102 and the integrated device 106. Electrically coupling the integrated device 104 and the integrated device 106 can lead to very long interconnects between the integrated devices 104 and 106, which can lead to lower package performances. There is an ongoing need to provide more compact packages and better performing packages.

SUMMARY

Various features relate to packages that include an integrated device, but more specifically to a package that includes an integrated device and a substrate.

One example provides a package comprising a substrate comprising a plurality of interconnects, a first integrated device coupled to the substrate, a second integrated device coupled to the substrate, and an interconnect device coupled to the substrate. The first integrated device, the second integrated device, the interconnect device and the substrate are configured to provide an electrical path for an electrical signal between the first integrated device and the second integrated device, that extends through at least the substrate, through the interconnect device and back through the substrate. The electrical path includes at least one interconnect that extends diagonally.

Another example provides an apparatus comprising a substrate comprising a plurality of interconnects, a first integrated device coupled to the substrate, a second integrated device coupled to the substrate, and means for device interconnection coupled to the substrate. The first integrated device, the second integrated device, means for device interconnection and the substrate are configured to provide an electrical path for an electrical signal between the first integrated device and the second integrated device, that extends through at least the substrate, through the means for device interconnection and back through the substrate. The electrical path includes at least one interconnect that extends diagonally.

Another example provides a method for fabricating a package. The method provides a substrate comprising a plurality of interconnects. The method couples a first integrated device to the substrate. The method couples a second integrated device to the substrate. The method couples an interconnect device to the substrate. The first integrated device, the second integrated device, the interconnect device and the substrate are configured to provide an electrical path for an electrical signal between the first integrated device and the second integrated device, that extends through at least the substrate, through the interconnect device and back through the substrate. The electrical path includes at least one interconnect that extends diagonally.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package that includes a substrate comprising a plurality of interconnects, a first integrated device coupled to the substrate, a second integrated device coupled to the substrate, and an interconnect device coupled to the substrate. The first integrated device, the second integrated device, the interconnect device and the substrate are configured to provide an electrical path for an electrical signal between the first integrated device and the second integrated device, that extends through at least the substrate, then through the interconnect device and back through the substrate. The electrical path includes at least one interconnect that extends diagonally.

The substrate further includes a plurality of interconnects for providing electrical paths to a board. The integrated device is coupled to the first surface (or a second surface) of the substrate. The interconnect device is coupled to the first surface (or a second surface) of the substrate. The first integrated device, the second integrated device, the interconnect device, and the substrate are configured to provide an electrical path for an electrical signal between the first integrated device and the second integrated device, that extends through at least the substrate, then through the interconnect device and back through the substrate. The interconnect device may provide at least one electrical path (e.g., electrical connection) between two integrated devices coupled to the substrate. The interconnect device may be an interconnect integrated device that includes a substrate (e.g., silicon), a plurality of interconnects, and at least one dielectric layer. The interconnect device may be a substrate that includes at least one dielectric layer and a plurality of interconnects. The plurality of interconnects of the interconnect device may be arranged in a Manhattan configuration. The plurality of interconnects arranged in a Manhattan configuration may be configured to provide diagonal interconnects between the first integrated device and the second integrated device. Diagonal interconnects help provide shorter paths between integrated devices, which can improve the performance of each integrated devices.

Figure 1:
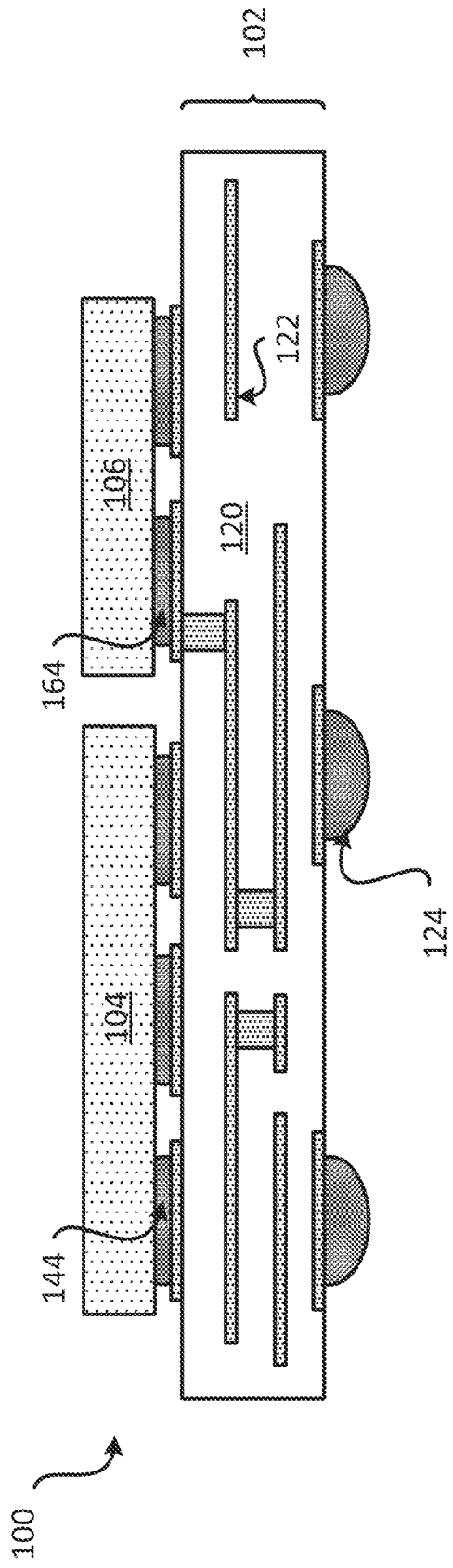
FIG. 1 illustrates a profile view of a package that includes an integrated device and a substrate.
Figure 2:
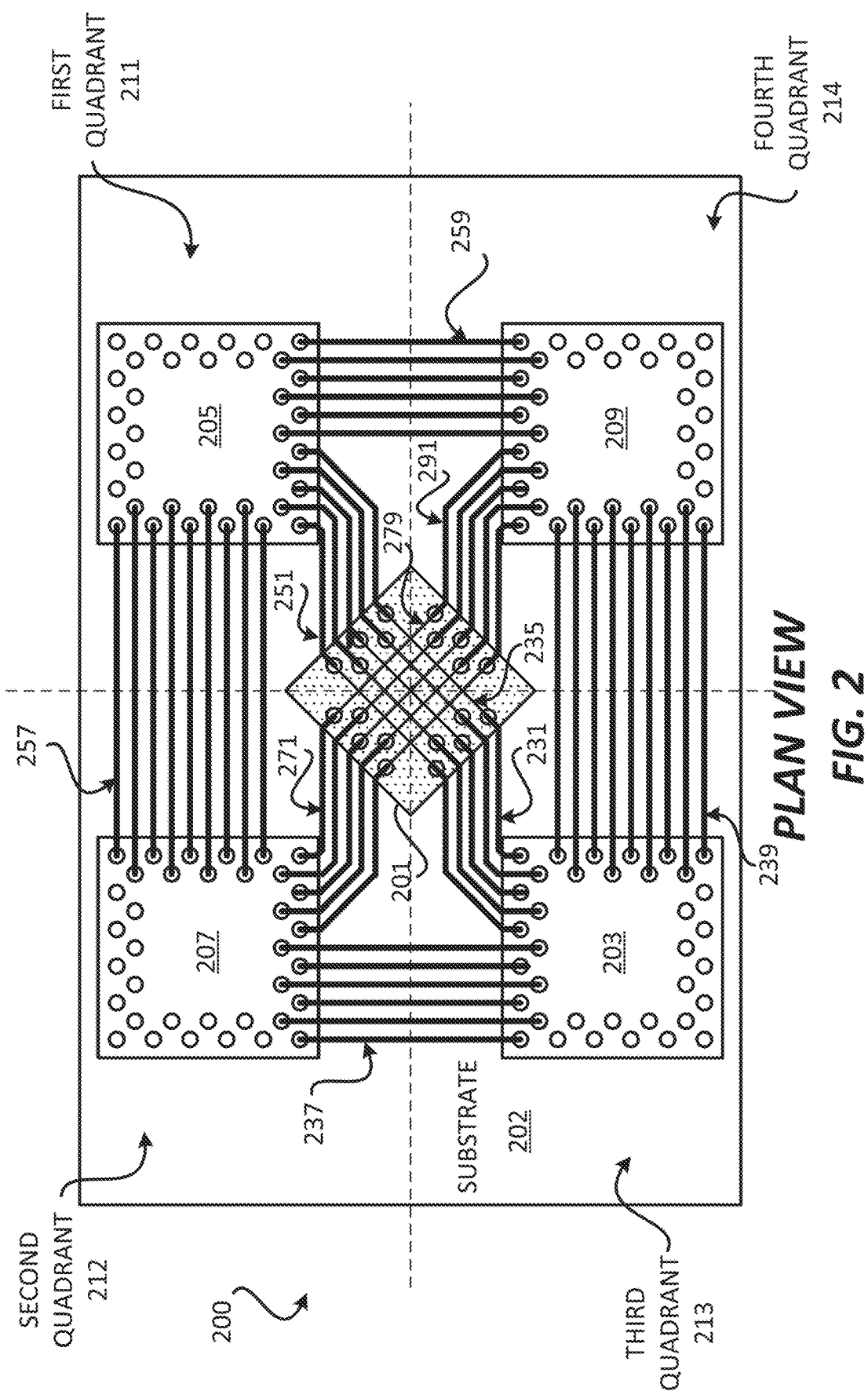
FIG. 2 illustrates a plan view of a package that includes an interconnect device coupled to a substrate.

Exemplary Package Comprising an Interconnect Device Configured for Diagonal Routing FIG. 2 illustrates a plan view of a package 200 that includes an interconnect device. The package 200 includes a substrate 202, an interconnect device 201, an integrated device 203, an integrated device 205, an integrated device 207, and an integrated device 209. The interconnect device 201, the integrated device 203, the integrated device 205, the integrated device 207 and the integrated device 209 are coupled to the substrate 202. As will be further described below, the interconnect device 201 may include an interposer, a substrate and/or a die, that is configured to provide diagonal routing for the package 200. The interconnect device 201 may be a means for device interconnection. The interconnect device 201 may be configured as a bridge between two or more integrated devices.

FIG. 2 illustrates various interconnects and electrical paths for electrical signals between different integrated devices. For example, FIG. 2 illustrates (i) a plurality of interconnects 237 between the integrated device 203 and the integrated device 207, (ii) a plurality of interconnects 239 between the integrated device 203 and the integrated device 209, (iii) a plurality of interconnects 257 between the integrated device 205 and the integrated device 207, (iv) a plurality of interconnects 259 between the integrated device 205 and the integrated device 209, (v) a plurality of interconnects 231 between the interconnect device 201 and the integrated device 203, (vi) a plurality of interconnects 251 between the interconnect device 201 and the integrated device 205, (vii) a plurality of interconnects 271 between the interconnect device 201 and the integrated device 207, (viii) a plurality of interconnects 291 between the interconnect device 201 and the integrated device 209, (ix) a plurality of interconnects 235 in the interconnect device 201, and (x) a plurality of interconnects 279 in the interconnect device 201.

The plurality of interconnects 237 between the integrated device 203 and the integrated device 207 may include interconnects in the substrate 202. The plurality of interconnects 239 between the integrated device 203 and the integrated device 209 may include interconnects in the substrate 202. The plurality of interconnects 257 between the integrated device 205 and the integrated device 207 may include interconnects in the substrate 202. The plurality of interconnects 259 between the integrated device 205 and the integrated device 209 may include interconnects in the substrate 202. The plurality of interconnects 231 between the interconnect device 201 and the integrated device 203 may include interconnects in the substrate 202. The plurality of interconnects 251 between the interconnect device 201 and the integrated device 205 may include interconnects in the substrate 202. The plurality of interconnects 271 between the interconnect device 201 and the integrated device 207 may include interconnects in the substrate 202. The plurality of interconnects 291 between the interconnect device 201 and the integrated device 209 may include interconnects in the substrate 202. The plurality of interconnects 235 may include interconnects (e.g., interconnects in a first metal layer) in the interconnect device 201. The plurality of interconnects 279 may include interconnects (e.g., interconnects in a second metal layer) in the interconnect device 201. The interconnects that define the various electrical paths may include Manhattan interconnects (e.g., interconnects that extend vertically and/or horizontally in the X-Y plane) and/or diagonal interconnects in the (X-Y plane). Manhattan interconnects of the interconnect device 201 may be interconnects that extend along the same direction as the side walls of the interconnect device 201. Manhattan interconnects of the interconnect device 201 may be interconnects that are parallel and/or perpendicular to the side wall of the interconnect device 201. The plurality of interconnects 235 and/or the plurality of interconnects 279 may be examples of Manhattan interconnects of the interconnect device 201.

The integrated device 203 may be configured to be electrically coupled to the integrated device 205 through the interconnect device 201. For example, the integrated device 203 may be configured to be electrically coupled to the integrated device 205 through the plurality of interconnects 231, the plurality of interconnects 235 and the plurality of interconnects 251. In such an example, at least one electrical signal between the integrated device 203 and the integrated device 205 may travel through interconnects in the substrate 202, through interconnects in the interconnect device 201 and back through interconnects in the substrate 202.

The integrated device 207 may be configured to be electrically coupled to the integrated device 209 through the interconnect device 201. For example, the integrated device 207 may be configured to be electrically coupled to the integrated device 209 through the plurality of interconnects 271, the plurality of interconnects 279 and the plurality of interconnects 291. In such an example, at least one electrical signal between the integrated device 207 and the integrated device 205 may travel through interconnects in the substrate 202, through interconnects in the interconnect device 201 and back through interconnects in the substrate 202.

The use of the interconnect device 201 provides diagonal interconnects that help reduce the interconnect distance between integrated devices that are diagonally positioned relative to one other (e.g., integrated devices located in first quadrant 211 and a third quadrant 213). This helps improve the performance of the integrated devices. It is noted that interconnect device 201 includes interconnects that are arranged in a Manhattan configuration, where interconnects in the interconnect device 201 are orthogonal and/or parallel to one another. The interconnects in the interconnect device 201 may be orthogonal and/or parallel to the side surface(s) of the interconnect device 201. For example, interconnects in a first direction may located on a first metal layer of the interconnect device 201, and interconnects in a second direction may located in a second metal layer of the interconnect device 201. The second direction may be orthogonal to the first direction, and vice versa. The first direction may include a first diagonal direction, and the second direction may include a second diagonal direction that is orthogonal (e.g., perpendicular) to the first diagonal direction. The diagonal directions may be relative to directions in the substrate 202. Thus, although the interconnects of the interconnect device 201 may be vertical and horizontal (in the X-Y plane) in the interconnect device 201, when the interconnect device 201 is coupled to the substrate 202 in a rotated configuration, these interconnects (e.g., 235, 279) are configured as diagonal interconnects relative to the substrate 202 (e.g., relative to the side of the substrate 202) and interconnects of the substrate 202. The interconnects of the interconnect device 201 may include (i) a first plurality of interconnects 235 arranged in a first direction, wherein the first plurality of interconnects 235 is configured to provide at least one electrical path between a first pair of integrated devices (e.g., integrated devices 203 and 205) and (ii) a second plurality of interconnects 279 arranged in a second direction, where the second direction is orthogonal to the first direction, and where the second plurality of interconnects 279 is configured to provide at least one electrical path between a second pair of integrated devices (e.g., integrated devices 207 and 209).

FIG. 2 illustrates the integrated device 203, the integrated device 205, the integrated device 207 and the integrated device 209 are arranged in a quadrant configuration. The integrated device 205 may be coupled to a first quadrant 211 of the substrate 202, the integrated device 207 may be coupled to a second quadrant 212 of the substrate 202, the integrated device 203 may be coupled to a third quadrant 213 of the substrate 202, and the integrated device 209 may be coupled to a fourth quadrant 214 of the substrate 202. The first quadrant 211 may be located diagonally to the third quadrant. 213 The second quadrant 212 may be located diagonally to the fourth quadrant 214. The interconnect device 201 allows (i) diagonal interconnects between integrated devices in the first quadrant 211 and the third quadrant 213, and (ii) diagonal interconnects between integrated devices in the second quadrant 212 and the fourth quadrant 214. The interconnect device 201 is coupled to the substrate 202 in a rotated configuration relative to the first integrated device and the second integrated device. The rotation of the interconnect device 201 allows for diagonal interconnects between integrated devices (even if the majority of the interconnects of the interconnect device 201 are not diagonal in the interconnect device 201). The interconnect device 201 may be rotated by 45 degrees relative to at least one integrated device (e.g., 203, 205, 207, 209). It is noted that the interconnect device 201 may be rotated by other degrees (e.g., 1 degree-89 degrees) relative to other integrated device(s). Moreover, the interconnect device 201 may include interconnects that have finer (e.g., smaller) interconnects spacing and width than the interconnects of the substrate 202. The interconnect device 201 may be considered rotated relative to the at least one integrated device, when at least one side wall of the interconnect device 201 is diagonal to the side wall of the substrate 202 and/or the side wall(s) of at least one integrated device (e.g., 203, 205, 207, 209). The interconnect device 201 may be considered rotated relative to the at least one integrated device, when at least one side wall of the interconnect device 201 is not parallel and not perpendicular to the side wall of the substrate 202 and/or the side wall(s) of at least one integrated device (e.g., 203, 205, 207, 209). It is noted that the plan view of the package 200 and/or the substrate 202 may represent a portion of the of the package 200 and/or the substrate 202, and may not necessarily represent the entire plan view of the package 200 and/or the substrate 202. Moreover, the quadrants that are shown in FIG. 2 may represent a portion of the package 200 and/or a portion of the substrate 202.

Figure 3:
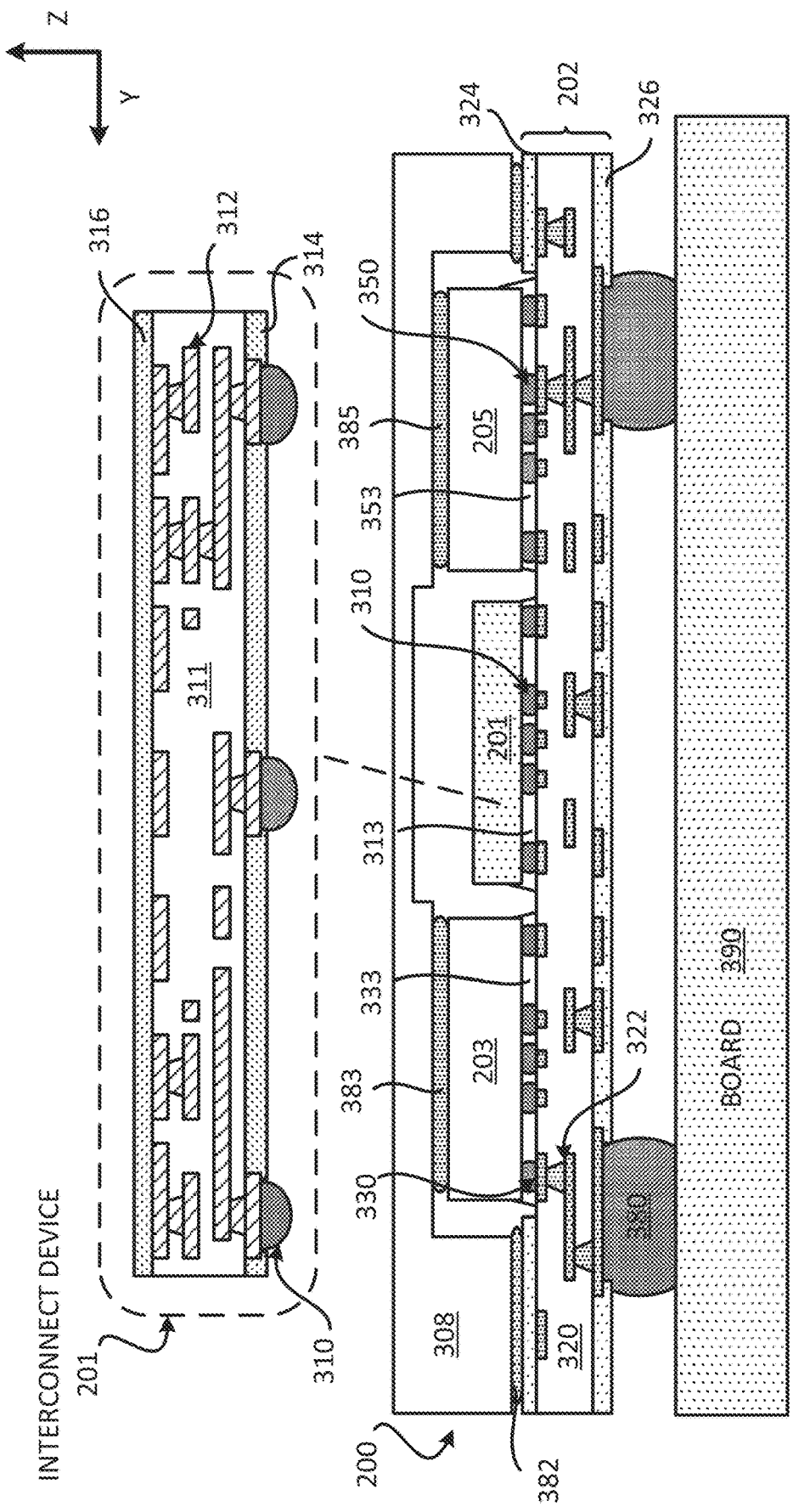
FIG. 3 illustrates a profile view of a package that includes an interconnect device coupled to a substrate.

FIG. 3 illustrates a profile view of a package 200 that includes an interconnect device. The package 200 is coupled to a board 390 (e.g., printed circuit board (PCB)) through a plurality of solder interconnects 380. The package 200 provides a package with a compact small factor while also having a high input/output pin count. The package 200 may provide improved capacitance density, shorter paths between integrated devices, lower inductance, and/or less routing constraints.

The package 200 includes the substrate 202, the interconnect device 201, the integrated device 203, the integrated device 205, the integrated device 207 (not shown), the integrated device 209 (not shown), and a heat spreader 308. The interconnect device 201 may be configured as a bridge between two or more integrated devices. The interconnect device 201 may be a high-density interconnect device. The heat spreader 308 is coupled to the substrate 202 through a thermal interface material (TIM) 382. The heat spreader 308 is coupled to the integrated device 203 through the thermal interface material (TIM) 383. The heat spreader 308 is coupled to the integrated device 205 through the thermal interface material (TIM) 385.

As will be further described below, an integrated device (e.g., 203, 205, 207, 209), an interconnect device (e.g., 201), and the substrate 202 are coupled together in such a way that when an electrical signal (e.g., first electrical signal, second electrical signal) travels between two integrated devices (e.g., 203, 205), the electrical signal travels through at least the substrate 202, then through the interconnect device (e.g., 201) and back through the substrate 202. This may be achieved by an interconnect device (e.g., 201) providing at least one electrical path between a first electrical contact provided by the substrate 202 and a second electrical contact provided by the substrate 202, where the first contact is electrically connected to the integrated device (e.g., 203, 205) and where the second contact is electrically connected to one or more of the interconnects. In the above example, the interconnect device 201 may be configured as a bridge such that when at least one electrical signal travels between two integrated devices (e.g., 203, 205), the at least one electrical signal may travel through the interconnect device 201. The at least one electrical signal may travel through at least one electrical path that is defined by interconnects (e.g., traces, vias, pads, solder interconnects, pillar interconnects) of the package, the integrated device(s), the substrate and/or the interconnect device(s).

The substrate 202 includes a first surface (e.g., top surface) and a second surface (e.g., bottom surface). The substrate 202 includes at least one dielectric layer 320, a plurality of interconnects 322, a first solder resist layer 324 and a second solder resist layer 326. The plurality of interconnects 322 may be configured to provide at least one electrical path to and/or from a board (e.g., 390). The plurality of interconnects 322 may provide at least one electrical path to at least one integrated device (e.g., 203, 205, 207, 209). The plurality of interconnects 322 may provide at least one electrical path (e.g., electrical connection) between two or more integrated devices (e.g., 203, 205, 207, 209). The plurality of interconnects 322 may have a first minimum pitch and a first minimum line and spacing (L/S). In some implementations, the first minimum pitch for the plurality of interconnects 322 is in a range of approximately 100-200 micrometers (μm). In some implementations, the first minimum line and spacing (L/S) for the plurality of interconnects 322 is in a range of approximately 9/9-12/12 micrometers (μm) (e.g., minimum line width of approximately 9-12 micrometers (μm), minimum spacing of approximately 9-12 micrometers (μm)). Different implementations may use different substrates. The substrate 202 may be a laminate substrate, a coreless substrate, an organic substrate, a substrate that includes a core layer (e.g., cored substrate). In some implementations, the at least one dielectric layer 320 may include a core layer and/or prepreg layers. The at least one dielectric layer 320 may have a dielectric constant in a range of approximately 3.5-3.7. The at least one dielectric layer 320 may include glass fabrics for reinforcing the substrate 202. An example of fabricating a substrate is further described below in FIGS. 10A-10C. As will be further described below, in some implementations, the substrate 202 may be fabricated using a modified semi-additive process (mSAP) or a semi-additive process (SAP).

The first integrated device 203 is coupled to the first surface (e.g., top surface) of the substrate 202. The integrated device 203 is coupled to the substrate through a plurality of solder interconnects 330. The plurality of solder interconnects 330 may include pillar interconnects (e.g., copper pillars) and/or solder interconnects. An underfill 333 is located between the substrate 202 and the integrated device 203 (e.g., first integrated device). The underfill 333 may surround the plurality of solder interconnects 330. The integrated device 205 is coupled to the first surface (e.g., top surface) of the substrate 202. The integrated device 205 (e.g., second integrated device) is coupled to the substrate through a plurality of solder interconnects 350. The plurality of solder interconnects 350 may include pillar interconnects (e.g., copper pillars) and/or solder interconnects. An underfill 353 is located between the substrate 202 and the integrated device 205. The underfill 353 may surround the plurality of solder interconnects 350.

The interconnect device 201 is coupled to the first surface of the substrate 202. As will be further described below, the interconnect device 201 may be a high-density interconnect device. The interconnect device 201 may be coupled to the substrate 202 through a plurality of solder interconnects 310 and/or pillar interconnects (e.g., copper pillar interconnects). The interconnect device 201 is located laterally between the first integrated device 203 and the second integrated device 205. This configuration helps improve the performance of the package, by reducing routing congestion in the substrate 202, and/or by reducing the paths for currents (e.g., signals) between the integrated devices. The end result, is a package with a more compact form factor. In addition, the interconnect device 201 may help lower the cost of the substrate 202. In some implementations, at least one interconnect device may be located over another surface of the substrate 202. In some implementations, the interconnect device may be integrated or embedded inside the substrate 202. An interconnect device may be configured to provide at least one electrical path for at least one electrical signal. As will be further described below, an interconnect device (e.g., 201) may be configured as a bridge. An interconnect device (e.g., 201) may include a die (e.g., passive device die). An interconnect device that is configured as a bridge and/or a passive device die may be free of active devices, such as transistors. Thus, an interconnect device that is configured as a bridge and/or a passive device die may be free of a transistor. However, an interconnect device that is configured as a bridge and/or a passive device die may include a transistor that is not part of the circuit that electrically couples other integrated devices.

The integrated device (e.g., 203, 205, 207, 209) may include a die (e.g., semiconductor bare die). The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filters, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 203, 205, 207, 209) may include at least one electronic circuit (e.g., first electronic circuit, second electronic circuit, etc. . . . ).

The various components may have various dimensions and various spacing between components. For example, the interconnect device 201 may have dimensions of approximately 8×8 millimeters, and one or more integrated device (e.g., 203, 205, 207, 209) may have dimensions of approximately 15×10 millimeters. The spacing between the interconnect device 201 and an integrated device (e.g., 203, 205, 207, 209) may be approximately 300 micrometers. The spacing between two neighboring integrated devices (e.g., 203 and 209, 203 and 207) may be approximately 500 micrometers. It is noted that these dimensions are exemplary. In some implementations, the dimensions and/or spacing may be greater or lesser. Different implementations may couple different components to the substrate 202. Other components (e.g., surface mounted components) that may be coupled to the substrate 202 include a passive device (e.g., capacitor).

Different implementations may use different interconnect device 201. The interconnect device 201 may be implemented as a substrate with interconnects (e.g., interposer with interconnects). The interconnect device 201 may be implemented as a die (e.g., silicon die). The interconnect device 201 may be a high-density interconnect device that have a second minimum pitch and a second minimum line and spacing (L/S). In some implementations, the second minimum pitch for interconnects of the interconnect device (e.g., 201) is in a range of approximately 100-200 micrometers (μm). In some implementations, the second minimum line and spacing (L/S) for interconnects of the interconnect device (e.g., 201) is in a range of approximately 3/2-5/5 micrometers (μm) (e.g., minimum line width of approximately 3-5 micrometers (μm), minimum spacing of approximately 3-5 micrometers (μm)). The interconnect device 201 may have interconnects with a respective second minimum pitch that is less than the first minimum pitch of the substrate 202. Similarly, the interconnect device 201 may have interconnects with a respective minimum pitch that is less than the first minimum line and spacing (L/S) of the substrate 202. A pitch may be defined as a center-to-center distance between two adjacent interconnects. The interconnect device (e.g., 201) is a localized integrated device configured to be placed in a region near an integrated device and/or between integrated devices. The size of the interconnect device may vary with different implementations. However, the footprint of the interconnect device may be smaller than the footprint of the substrate 202.

As will be further described below, some electrical signals (e.g., first electrical signal, second electrical signals) to and from integrated devices (e.g., 203, 205) may be configured to travel through the interconnect device 201. The interconnect devices, which have higher density interconnects, allow the package 200 to provide higher I/O pin counts, without having to increase the size of the package 200. For example, using the interconnect device 201 may allow the substrate 202 to have a lower number of metal layers, which may help reduce the overall height of the package 200. The one or more interconnect device 201 may help reduce congestion and/or entanglement in certain regions (e.g., regions near an integrated device) of the substrate 202 due to the high number of pin count and/or number of netlists. The interconnect device 201 may have a lower height than the first integrated devices 203 and/or the second integrated device 205.

As mentioned above, the interconnect device 201 may include an interposer, a substrate and/or a die, that is configured to provide diagonal routing for the package 200. FIG. 3 illustrates that the interconnect device 201 includes at least one dielectric layer 311, a plurality of interconnects 312, a passivation layer 314 and a substrate 316. The substrate 316 may include silicon (Si), glass, or quartz. The substrate 316 may be a die substrate. The interconnect device 201 may include a front side and a back side. The back side of the interconnect device 201 may be the side that includes the substrate 316. The front side of the interconnect device 201 may be the side that includes the passivation layer 314 and/or the side to which the solder interconnect is coupled to the interconnect device 201. The front side of the interconnect device may be opposite to the back side of the interconnect device. As will be further described below, the interconnect device 201 (and/or any of the interconnect device described in the disclosure) may be configured as a bridge. The plurality of interconnects 312 may include the plurality of interconnects 235 and/or the plurality of interconnects 279.

The interconnect device 201 may include a die (e.g., passive device die). An interconnect device that is configured as a bridge and/or a passive device die may be free of active devices, such as transistors. Thus, an interconnect device that is configured as a bridge and/or a passive device die may be free of a transistor. However, an interconnect device that is configured as a bridge and/or a passive device die may include transistor(s) that are not part of the circuit between integrated devices. Thus, an interconnect device may include transistors, but such transistors are not included in electrical paths between integrated devices. As mentioned above, the interconnects of the interconnect device may have higher density (e.g., lower minimum pitch and/or lower minimum L/S) than the interconnects of the substrate 202. The passivation layer 314 is located over a first surface of the interconnect device 201. The plurality of solder interconnects 310 is coupled to the first surface of the interconnect device 201.

As mentioned above, an interconnect device may be a component that is coupled to the substrate 202, so that the package 200 may provide higher I/O pin counts without having to increase the overall size of the package 200 and/or may provide shorter paths between integrated devices. In some implementations, one or more electrical signals to and from one or more integrated devices may travel through one or more interconnect devices. The one or more interconnect devices (e.g., 201) may help reduce congestion and/or entanglement in certain areas of the substrate due to the high number of pin count and/or number of netlists. A netlist is an arrangement of components of a circuit and how the components are electrically coupled together. The one or more interconnect device 201 has improved capacitance density, provides shorter paths between integrated devices, helps lower inductance, and/or reduces routing constraints.

In some implementations, the at least one dielectric layer 311 may include prepreg layers and/or photo-imageable dielectric layers. The at least one dielectric layer 311 may have a dielectric constant in a range of approximately 3.3-4.0. In some implementations, the at least one dielectric layer 311 of the interconnect device may include glass fabrics. However, the glass fabrics will be finer than the glass fabrics in the at least one dielectric layer 320 of the substrate 202.

Figure 10A:
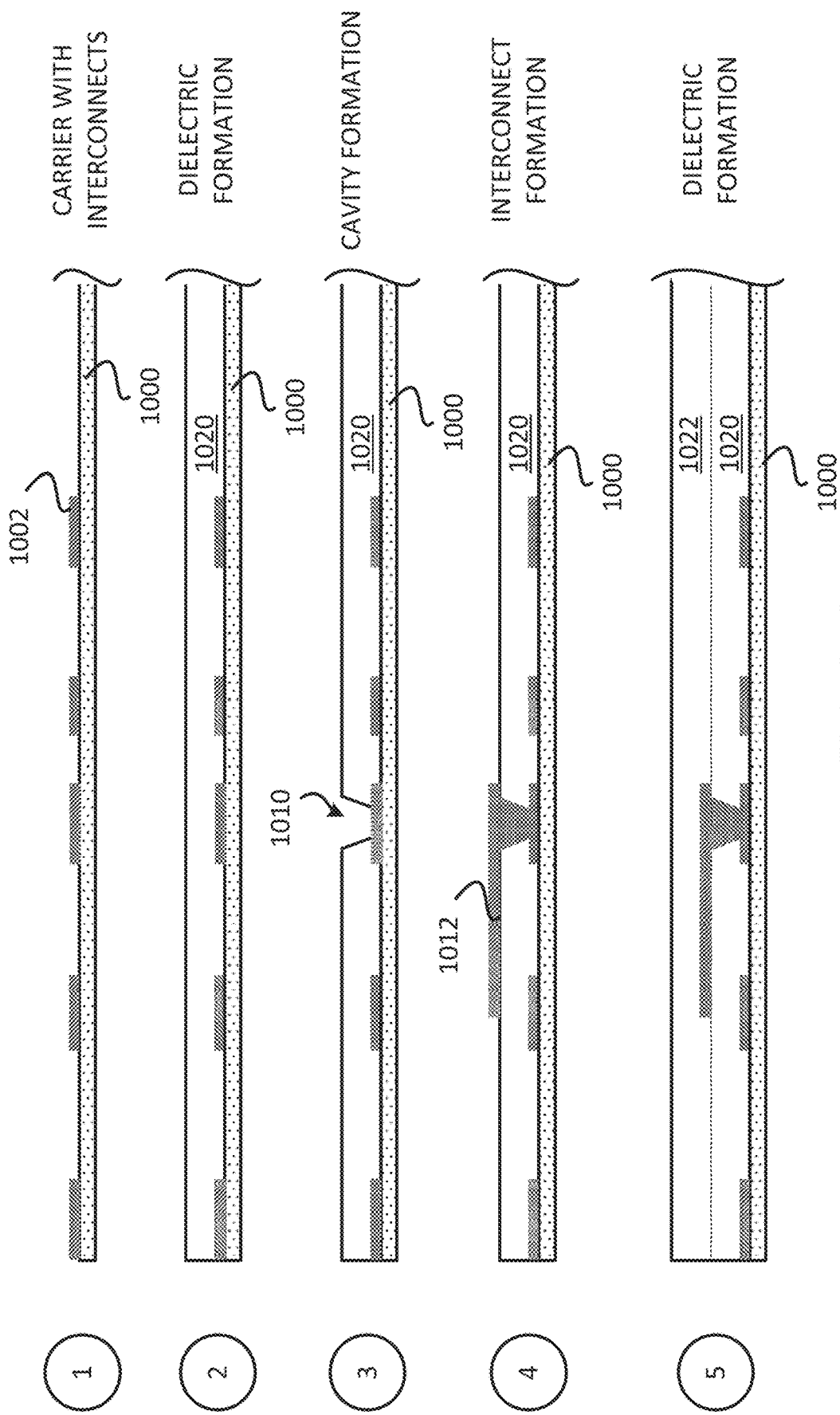
FIGS. 10A-10C illustrate an exemplary sequence for fabricating a substrate.
Figure 10B:
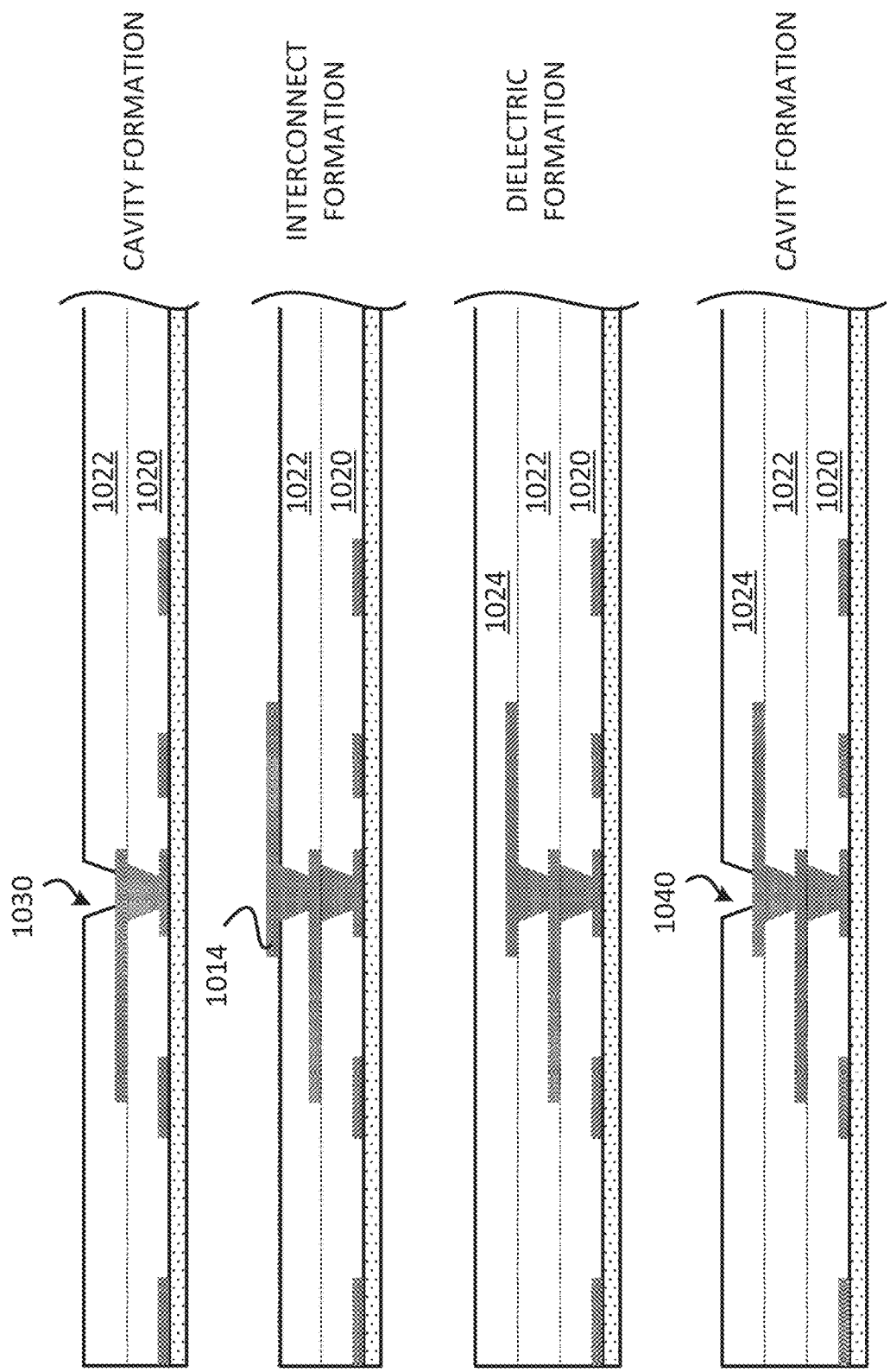
Figure 10C:
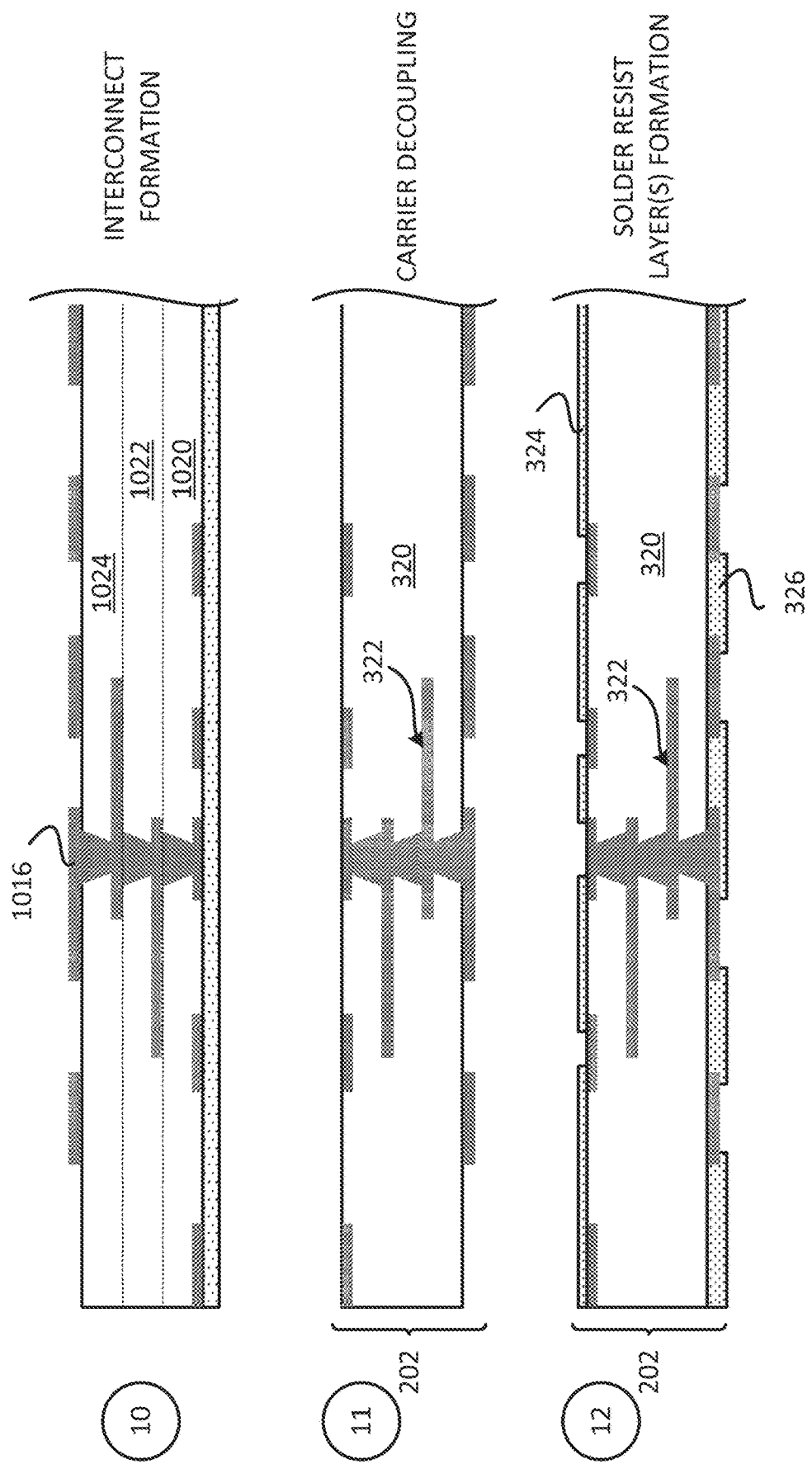

In some implementations, the interconnect device 201 may include an interposer and/or a substrate, that is similar to the substrate 202. The interconnect device 201 may include a coreless substrate or a cored substrate. The interconnect device 201 may have a plurality of interconnects and at least one dielectric layer, as described in FIG. 3. However, when the interconnect device 201 is implemented as substrate and/or an interposer, the dielectric layer(s) and/or the plurality of interconnects may be different that those described in FIG. 3. The interconnect device 201 may be fabricated using a similar process as the process used to fabricate the substrate 202. In some implementations, the interconnect device 201 may be fabricated using the process as described in FIGS. 10A-10C below. When the process described in FIGS. 10A-10C is used to fabricate the interconnect device 201, the interconnect device 201 may have interconnects with similar width and/or spacing as the interconnect of the substrate 202.

Figure 4:
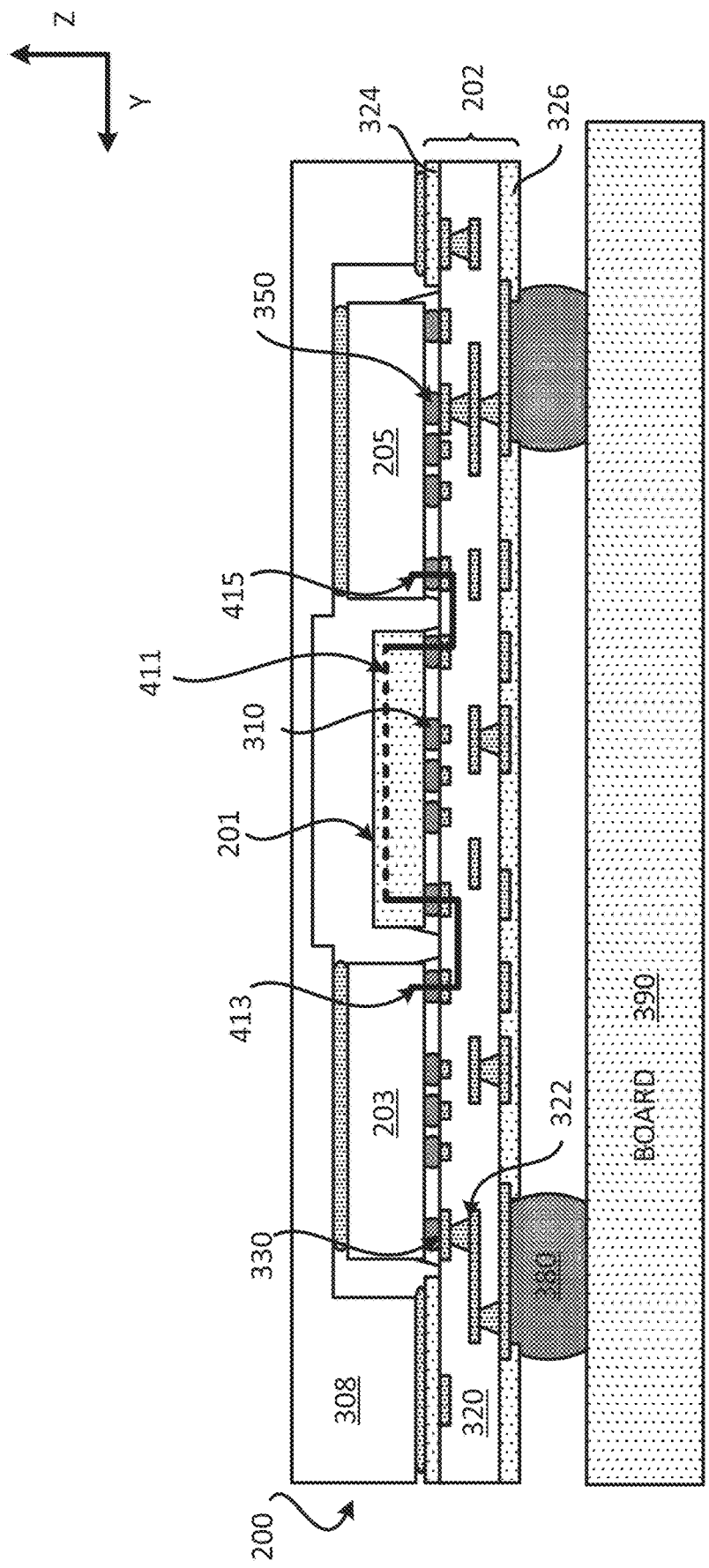
FIG. 4 illustrates a view of possible electrical paths in a package that includes an interconnect device coupled to a substrate.

FIG. 4 illustrates a view of how electrical signals may conceptually travel through a package. FIG. 4 illustrates the integrated device 203 that is configured to be electrically coupled to the integrated device 205 through an electrical path 413, an electrical path 411 and an electrical path 415. The electrical paths 411, 413 and 415 may be conceptual representations of exemplary paths for electrical currents between the integrated device 203 and the integrated device 205. An electrical path may include interconnects, pillar interconnects and/or solder interconnects. The electrical path 411 is configured to be electrical coupled to the electrical paths 413 and 415. The electrical paths 411, 413, and/or 415 may conceptually illustrate path(s) where at least one electrical signal may enter and exit through a front side of the interconnect device 201.

The electrical paths 411, 413 and 415 are electrical paths where currents (e.g., signals) travel through the interconnect device 201. The electrical paths 411, 413 and 415 may include interconnects in the substrate 402, interconnects in the interconnect device 201 and/or solder interconnects (e.g., 330, 310, 350). The electrical paths 413, 411 and/or 415 may include the plurality of interconnects 231, 235 and 251 of FIG. 2. Each electrical path (e.g., 413, 415) may include their own respective interconnects from the plurality of interconnects 322 of the substrate 202.

In one example, the integrated device 203 and the integrated device 205 are configured to be electrically coupled together such that at least one electrical current (e.g., electrical signal) between the integrated device 203 and the integrated device 205 travels through (i) first solder interconnect(s) from the plurality of solder interconnects 330, (ii) first interconnect(s) from the plurality of interconnects 322 of the substrate 202, (iii) first solder interconnect(s) from the plurality of solder interconnects 310, (iv) first interconnect(s) (e.g., 312) from the interconnect device 201, (v) second solder interconnect(s) from the plurality of solder interconnects 310, (vi) second interconnects(s) from the plurality of interconnects 322 of the substrate 202, and (vii) first solder interconnect from the plurality of solder interconnects 350.

The electrical path 411 may include (i) first solder interconnect(s) from the plurality of solder interconnects 310, (ii) first and/or second interconnect(s) (e.g., 312) from the interconnect device 201 and/or (ii) second solder interconnect(s) from the plurality of solder interconnects 310.

The electrical path 413 may include (i) first solder interconnect(s) from the plurality of solder interconnects 330, (ii) first interconnect(s) from the plurality of interconnects 322 of the substrate 202, (iii) first solder interconnect(s) from the plurality of solder interconnects 310, and/or (iv) first interconnect(s) (e.g., 312) from the interconnect device 201.

The electrical path 415 may include (i) first solder interconnect(s) from the plurality of solder interconnects 350, (ii) second interconnect(s) from the plurality of interconnects 322 of the substrate 202, (iii) second solder interconnect(s) from the plurality of solder interconnects 310, and/or (iv) second interconnect(s) (e.g., 312) from the interconnect device 201.

It is noted that the two or more of the various electrical paths described in the disclosure may be configured to be electrically coupled to each other. For example, the electrical path 411 may be configured to be electrically coupled to the electrical path 413 and the electrical path 415. It is noted that the electrical path(s) for one or more signals may enter and exit through the front side of the interconnect device (e.g., 201). That means that at least one electrical signal traveling through the interconnect device may (i) enter through a front side of the interconnect device, (ii) travel through interconnect(s) in the interconnect device, and (iii) exit through the front side of the interconnect device.

Figure 5:
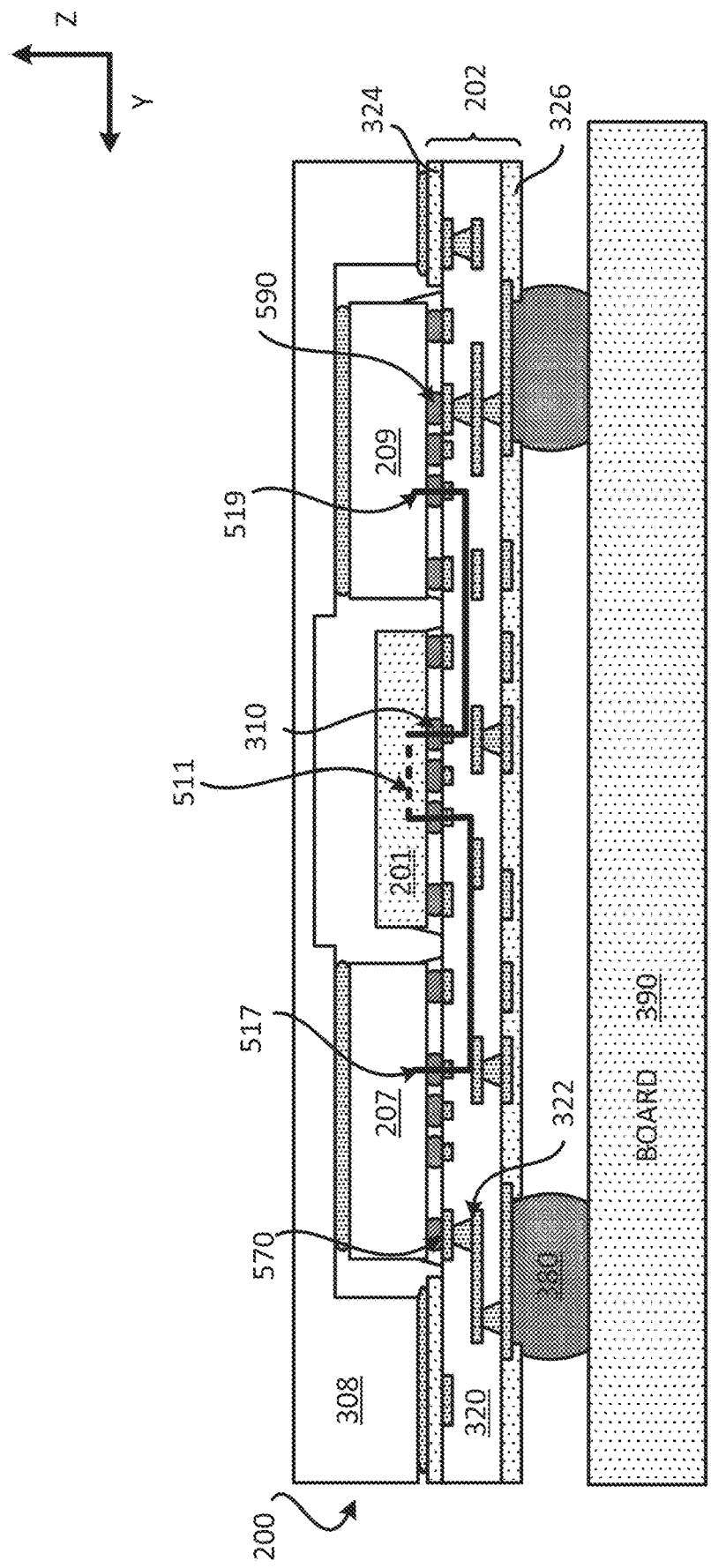
FIG. 5 illustrates a view of possible electrical paths in a package that includes an interconnect device coupled to a substrate.

FIG. 5 illustrates another view of how electrical signals may conceptually travel through a package. FIG. 5 illustrates the integrated device 207 that is configured to be electrically coupled to the integrated device 209 through an electrical path 517, an electrical path 511 and an electrical path 519. The electrical paths 511, 517 and 519 may be conceptual representations of exemplary paths for electrical currents between the integrated device 207 and the integrated device 209. An electrical path may include interconnects, pillar interconnects and/or solder interconnects. The electrical path 511 is configured to be electrical coupled to the electrical paths 517 and 519. The electrical paths 511, 517, and/or 519 may illustrate path(s) where at least one electrical signal may enter and exit through a front side of the interconnect device 201.

The electrical paths 511, 517 and 519 are electrical paths where currents (e.g., signals) travel through the interconnect device 201. The electrical paths 511, 517 and 519 may include interconnects in the substrate 402, interconnects in the interconnect device 201 and/or solder interconnects (e.g., 570, 310, 590). The electrical paths 517, 511 and/or 519 may include the plurality of interconnects 271, 279 and 291 of FIG. 2. Each electrical path (e.g., 517, 519) may include their own respective interconnects from the plurality of interconnects 322 of the substrate 202.

In one example, the integrated device 207 and the integrated device 209 are configured to be electrically coupled together such that at least one electrical current (e.g., electrical signal) between the integrated device 207 and the integrated device 209 travel through (i) first solder interconnect(s) from the plurality of solder interconnects 570, (ii) third interconnect(s) from the plurality of interconnects 322 of the substrate 202, (iii) third solder interconnect(s) from the plurality of solder interconnects 310, (iv) third interconnect(s) (e.g., 312) from the interconnect device 201, (v) fourth solder interconnect(s) from the plurality of solder interconnects 310, (vi) fourth interconnects(s) from the plurality of interconnects 322 of the substrate 202, and (vii) first solder interconnect from the plurality of solder interconnects 590.

The electrical path 511 may include (i) third solder interconnect(s) from the plurality of solder interconnects 310, (ii) third and/or fourth interconnect(s) (e.g., 312) from the interconnect device 201, and/or (iii) fourth solder interconnect(s) from the plurality of solder interconnects 310. The electrical path 511 may include interconnects located on a different metal layer than interconnects from the electrical path 411.

The electrical path 517 may include (i) first solder interconnect(s) from the plurality of solder interconnects 570, (ii) third interconnect(s) from the plurality of interconnects 322 of the substrate 202, (iii) third solder interconnect(s) from the plurality of solder interconnects 310, and/or (iv) third interconnect(s) (e.g., 312) from the interconnect device 201.

The electrical path 519 may include (i) first solder interconnect(s) from the plurality of solder interconnects 590, (ii) fourth interconnect(s) from the plurality of interconnects 322 of the substrate 202, (iii) fourth solder interconnect(s) from the plurality of solder interconnects 310, and/or (iv) fourth interconnect(s) (e.g., 312) from the interconnect device 201.

Figure 6:
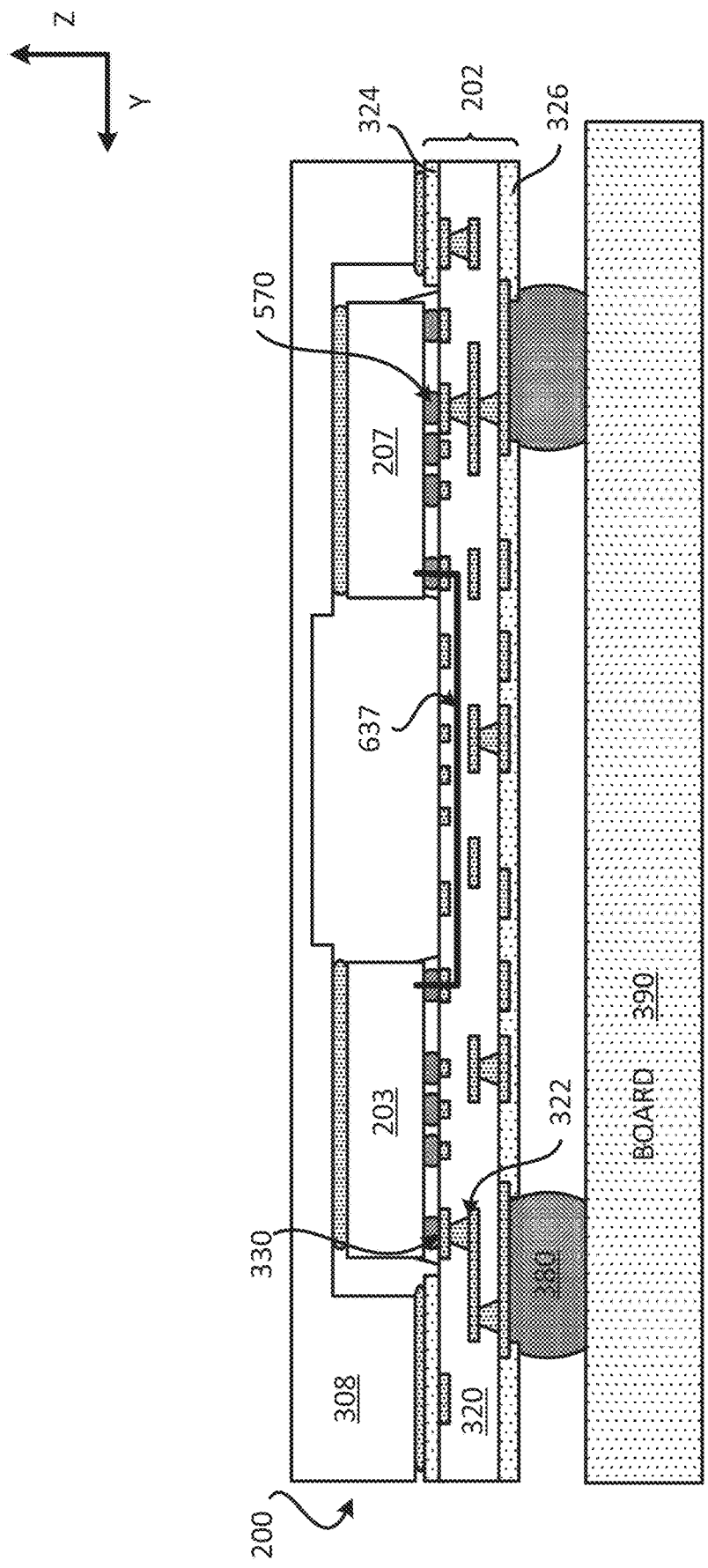
FIG. 6 illustrates a view of possible electrical paths in a package that includes an interconnect device coupled to a substrate.

FIG. 6 illustrates another view of how electrical signals may conceptually travel through a package. FIG. 6 illustrates the integrated device 203 that is configured to be electrically coupled to the integrated device 207 through an electrical path 637. The electrical path 637 may include interconnects (e.g., 322) in the substrate 402 and/or solder interconnects (e.g., 330, 570). The electrical path 637 may include the plurality of interconnects 237 of FIG. 2.

Figure 7:
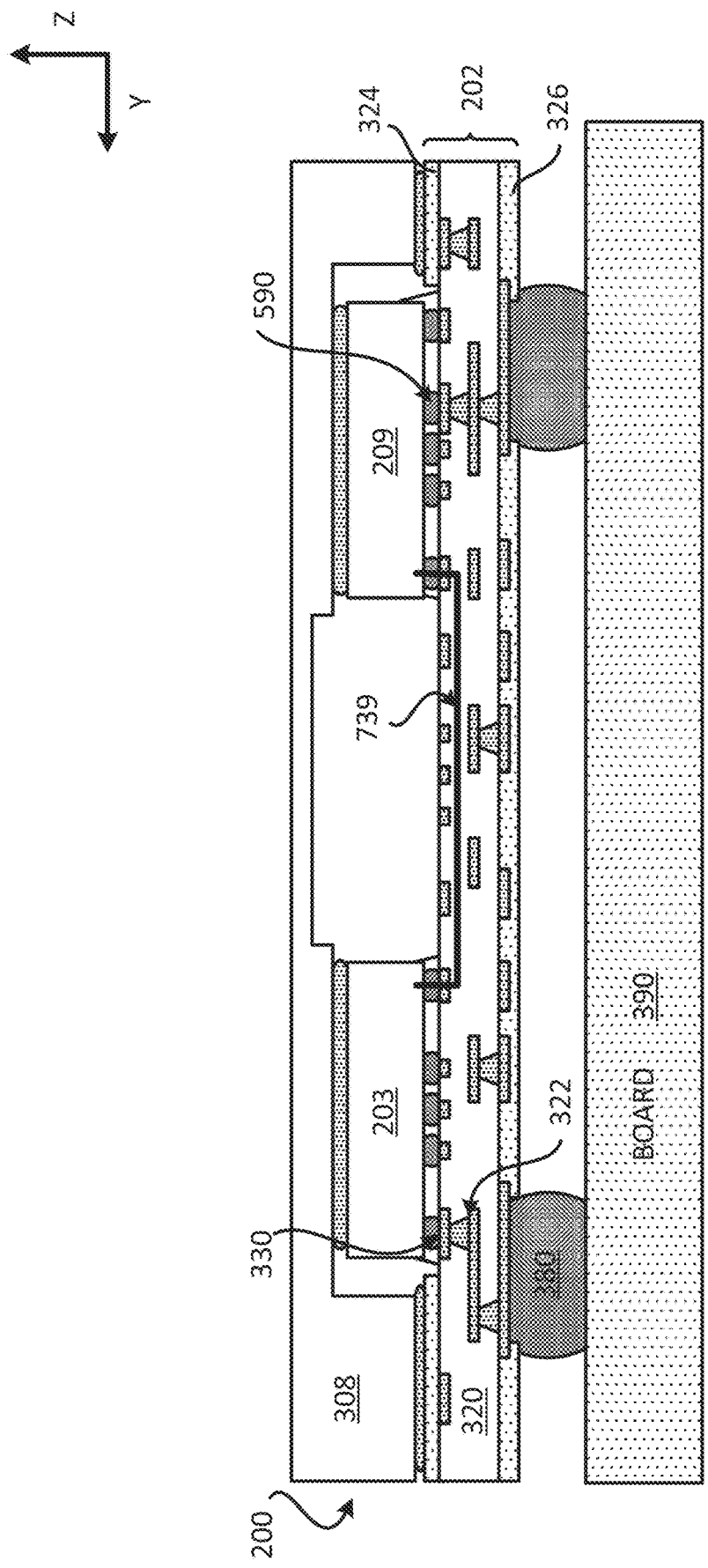
FIG. 7 illustrates a view of possible electrical paths in a package that includes an interconnect device coupled to a substrate.

FIG. 7 illustrates another view of how electrical signals may conceptually travel through a package. FIG. 7 illustrates the integrated device 203 that is configured to be electrically coupled to the integrated device 209 through an electrical path 739. The electrical path 739 may include interconnects (e.g., 322) in the substrate 402 and/or solder interconnects (e.g., 330, 590). The electrical path 739 may include the plurality of interconnects 239 of FIG. 2.

Different implementations may have different numbers of electrical paths and/or electrical paths that take up different routing.

The electrical paths may illustrate path(s) where at least one electrical signal may enter and exit through a front side of the interconnect device (e.g., 201). That means that an electrical signal traveling through an interconnect device may (i) enter through a front side of the interconnect device, (ii) travel through interconnect(s) in the interconnect device, and (iii) exit through the front side of the interconnect device. However, it is noted that the paths of the electrical signals shown in the disclosure are exemplary and/or conceptual. Different implementations may use different paths for the electrical signals. Moreover, electrical signals and/or electrical paths may travel through different types of interconnects (e.g., vias, traces, pads, pillars), solder interconnects and/or components (e.g., passive devices). Thus, for example, in some implementations, an electrical signal traveling between an integrated device and an interconnect device may travel through at least one intervening component (e.g., passive device, capacitor) between the integrated device and the interconnect device. Different implementations may have a different number of electrical signals that travel to and from different integrated devices. The path of these electrical signals may vary. An electrical signal may include I/O signals. Instead of I/O signals, the exemplary paths shown in the disclosure may be applicable to power and/or ground as well.

As mentioned above, the interconnect device 201 may be implemented as a die (e.g., bridge die) or as a substrate (e.g., bridge substrate, interposer). When the interconnect device 201 is implemented as a substrate (e.g., bridge substrate), the substrate may be a cored substrate or a coreless substrate. The interconnect device 201 may have various sizes and shapes. For example, in some implementations, the interconnect device 201 may have a rectangular shape (e.g., square shape) and have a lateral size of 8 mm×8 mm, or less. The integrated devices (e.g., 203, 205, 207, 209) have a rectangular shape (e.g., square shape). In some implementations, the interconnect device 201 may be spaced apart by approximately 300 micrometers from an integrated device. It is noted that any of the packages described in the disclosure may be part of a package on package (PoP). Moreover, the packages (e.g., 200, 700) described in the disclosure may be coupled to an interposer.

Exemplary Sequence for Fabricating an Interconnect Device

FIGS. 8A-8D illustrate an exemplary sequence for providing or fabricating an interconnect device. In some implementations, the sequence of FIGS. 8A-8D may be used to provide or fabricate the interconnect device 201 of FIG. 3, or any of the interconnect device described in the disclosure. The sequence of FIGS. 8A-8D may be used to fabricate an interconnect device that includes an interconnect die (e.g., interconnect integrated device).

It should be noted that the sequence of FIGS. 8A-8D may combine one or more stages in order to simplify and/or clarify the sequence for providing or fabricating the interconnect device. In some implementations, the order of the processes may be changed or modified. In some implementations, one or more of processes may be replaced or substituted without departing from the scope of the disclosure. Different implementations may fabricate an interconnect device differently.

Figure 8A:
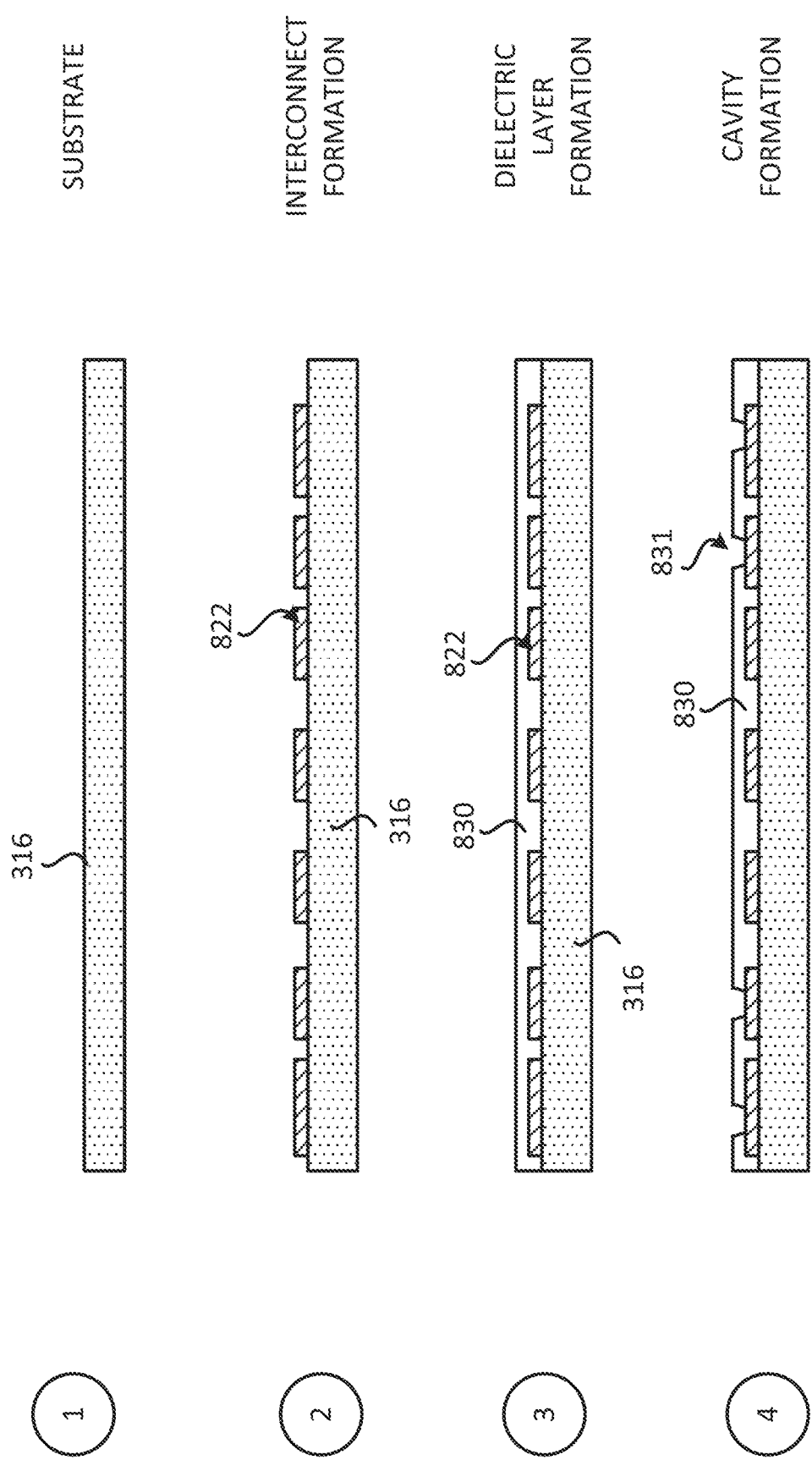
FIGS. 8A-8D illustrate an exemplary sequence for fabricating an interconnect device.

Stage 1, as shown in FIG. 8A, illustrates a state after a substrate 316 is provided. The substrate 316 may include glass and/or silicon.

Stage 2 illustrates a state after a plurality of interconnects 822 is formed over the substrate 316. The plurality of interconnects 822 may include traces and/or pads. Forming the plurality of interconnects 822 may include forming a seed layer, performing a lithography process, a plating process, a stripping process and/or an etching process. The plurality of interconnects 822 may be part of the plurality of interconnects 312.

Stage 3 illustrates a state after the dielectric layer 830 is formed over the plurality of interconnects 822 and the substrate 316. The dielectric layer 830 may be deposited and/or coated over the plurality of interconnects 822 and the dielectric layer 820. The dielectric layer 830 may include polymer. The dielectric layer 830 may be similar to the dielectric layer 311.

Stage 4 illustrates a state after cavities 831 are formed in the dielectric layer 830. An etching process may be used to form the cavities 831.

Figure 8B:
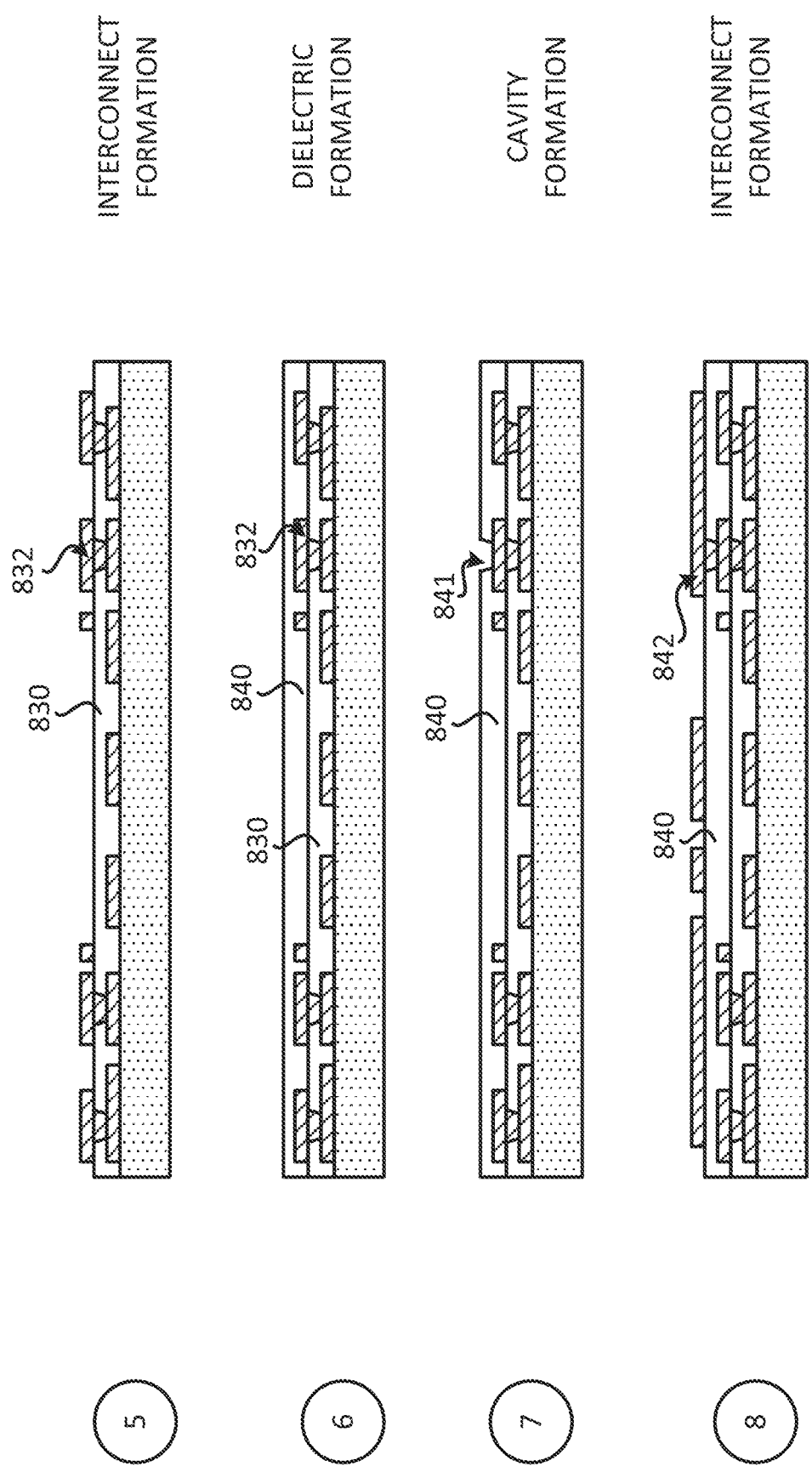

Stage 5, as shown in FIG. 8B, illustrates a state after a plurality of interconnects 832 is formed over the dielectric layer 830. The plurality of interconnects 832 may include vias, traces and/or pads. Forming the plurality of interconnects 832 may include performing a lithography process, a plating process, a stripping process and/or an etching process. The plurality of interconnects 832 may be part of the plurality of interconnects 312.

Stage 6 illustrates a state after the dielectric layer 840 is formed over the plurality of interconnects 832 and the dielectric layer 830. The dielectric layer 840 may be deposited and/or coated over the plurality of interconnects 832 and the dielectric layer 830. The dielectric layer 840 may include polymer. The dielectric layer 840 may be similar to the dielectric layer 830.

Stage 7 illustrates a state after cavities 841 are formed in the dielectric layer 840. An etching process may be used to form the cavities 841.

Stage 8 illustrates a state after a plurality of interconnects 842 is formed over the dielectric layer 840. The plurality of interconnects 842 may include vias, traces and/or pads. Forming the plurality of interconnects 842 may include performing a lithography process, a plating process, a stripping process and/or an etching process. The plurality of interconnects 842 may be part of the plurality of interconnects 312.

Figure 8C:
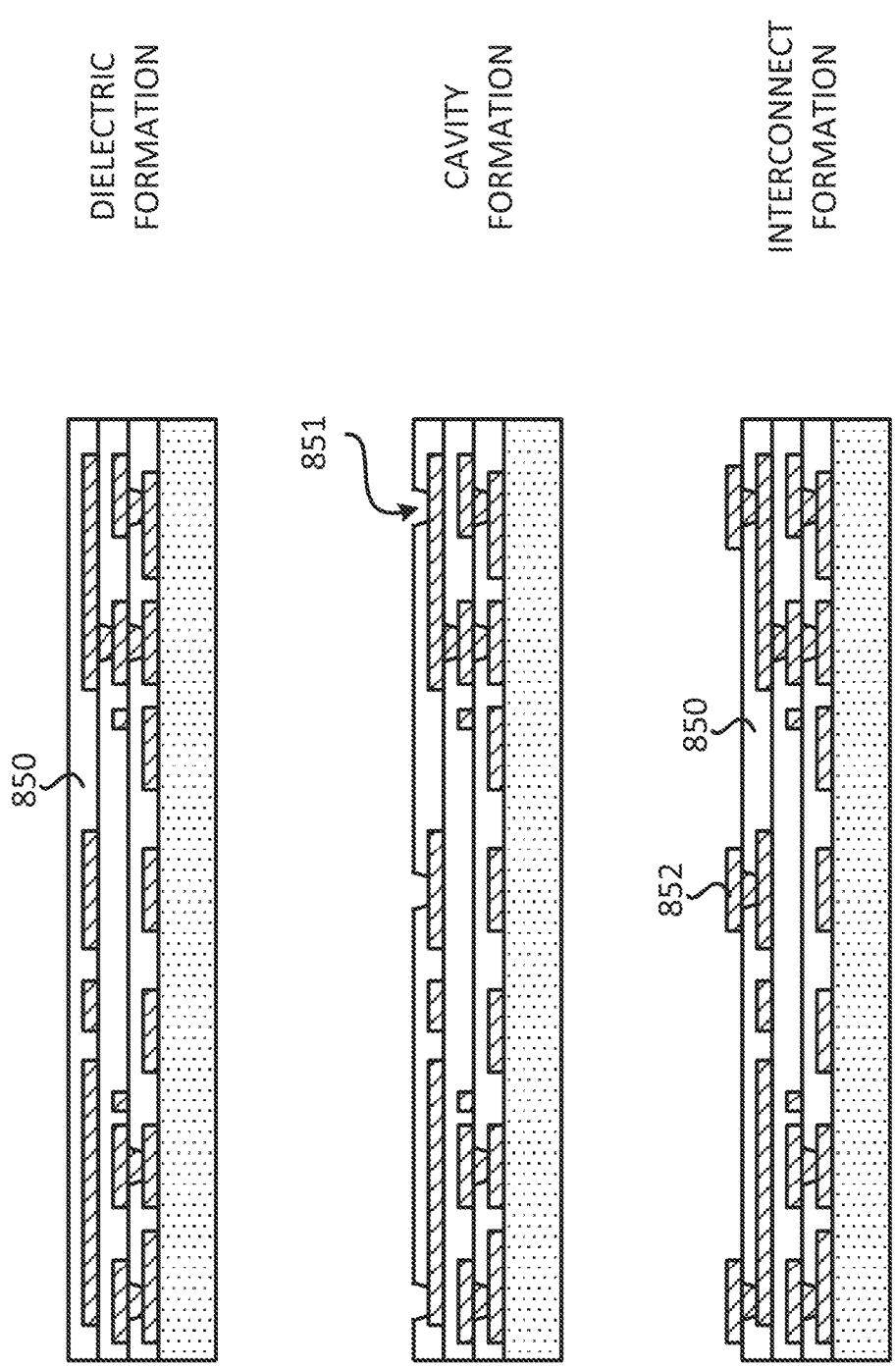

Stage 9, as shown in FIG. 8C, illustrates a state after the dielectric layer 850 is formed over the plurality of interconnects 842 and the dielectric layer 840. The dielectric layer 850 may be deposited and/or coated over the plurality of interconnects 842 and the dielectric layer 840. The dielectric layer 850 may include polymer. The dielectric layer 850 may be similar to the dielectric layer 840.

Stage 10 illustrates a state after cavities 851 are formed in the dielectric layer 850. An etching process may be used to form the cavities 851.

Stage 11 illustrates a state after a plurality of interconnects 852 is formed over the dielectric layer 850. The plurality of interconnects 852 may include vias, traces and/or pads. Forming the plurality of interconnects 852 may include performing a lithography process, a plating process, a stripping process and/or an etching process. The plurality of interconnects 852 may be part of the plurality of interconnects 312.

Figure 8D:
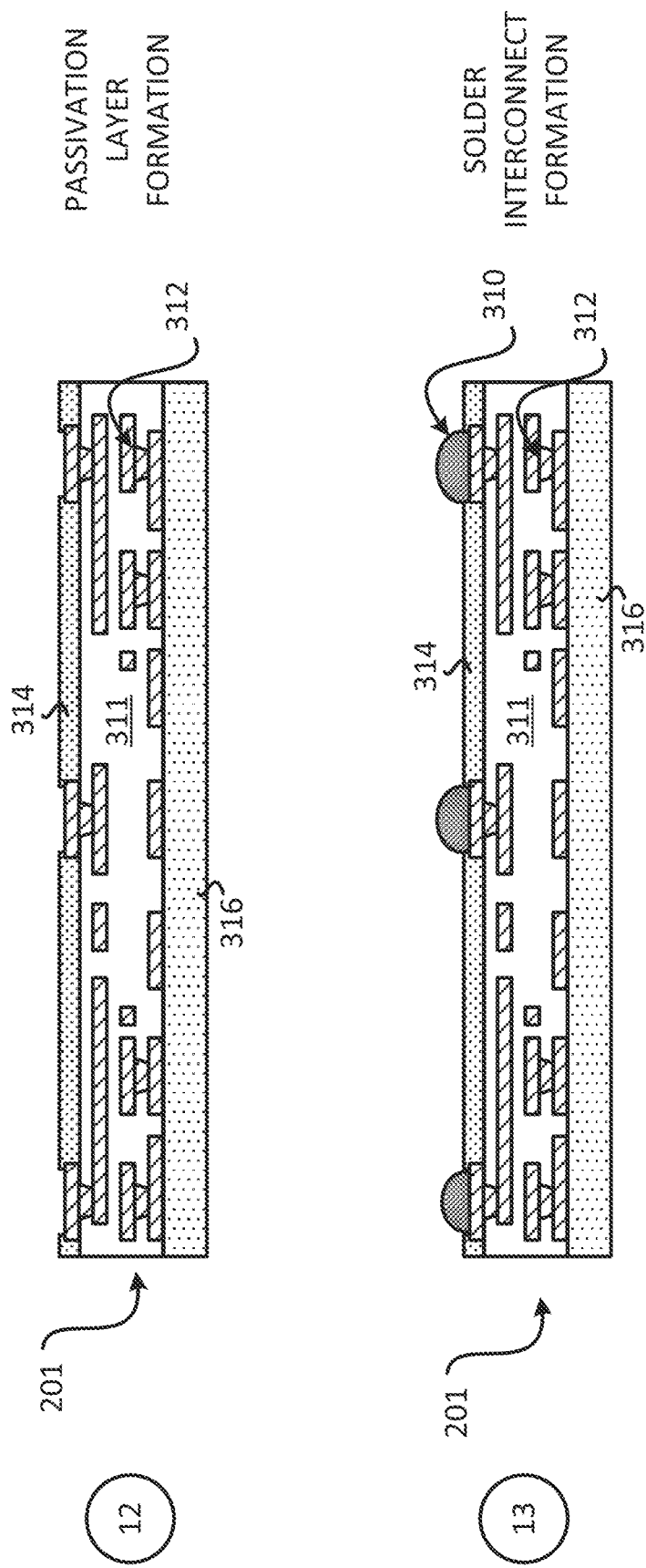

Stage 12, as shown in FIG. 8D, illustrates a state after the passivation layer 314 is formed over the at least one dielectric layer 311. The at least one dielectric layer 311 may represent the dielectric layers 830, 840 and 850. Stage 12 may illustrate the plurality of interconnects 312, which may include the plurality of interconnects 832, 842 and/or 852. Stage 12 may illustrate the interconnect device 201.

Stage 13 illustrates a state after the plurality of solder interconnects 310 is coupled to the interconnect device 201. Stage 13 may illustrate an example of the interconnect device 201 as described in FIG. 3. In some implementations, the interconnect device 201 is part of a wafer, and singulation may be performed to cut the wafer into individual interconnect devices.

Exemplary Flow Diagram of a Method for Fabricating an Interconnect device

Figure 9:
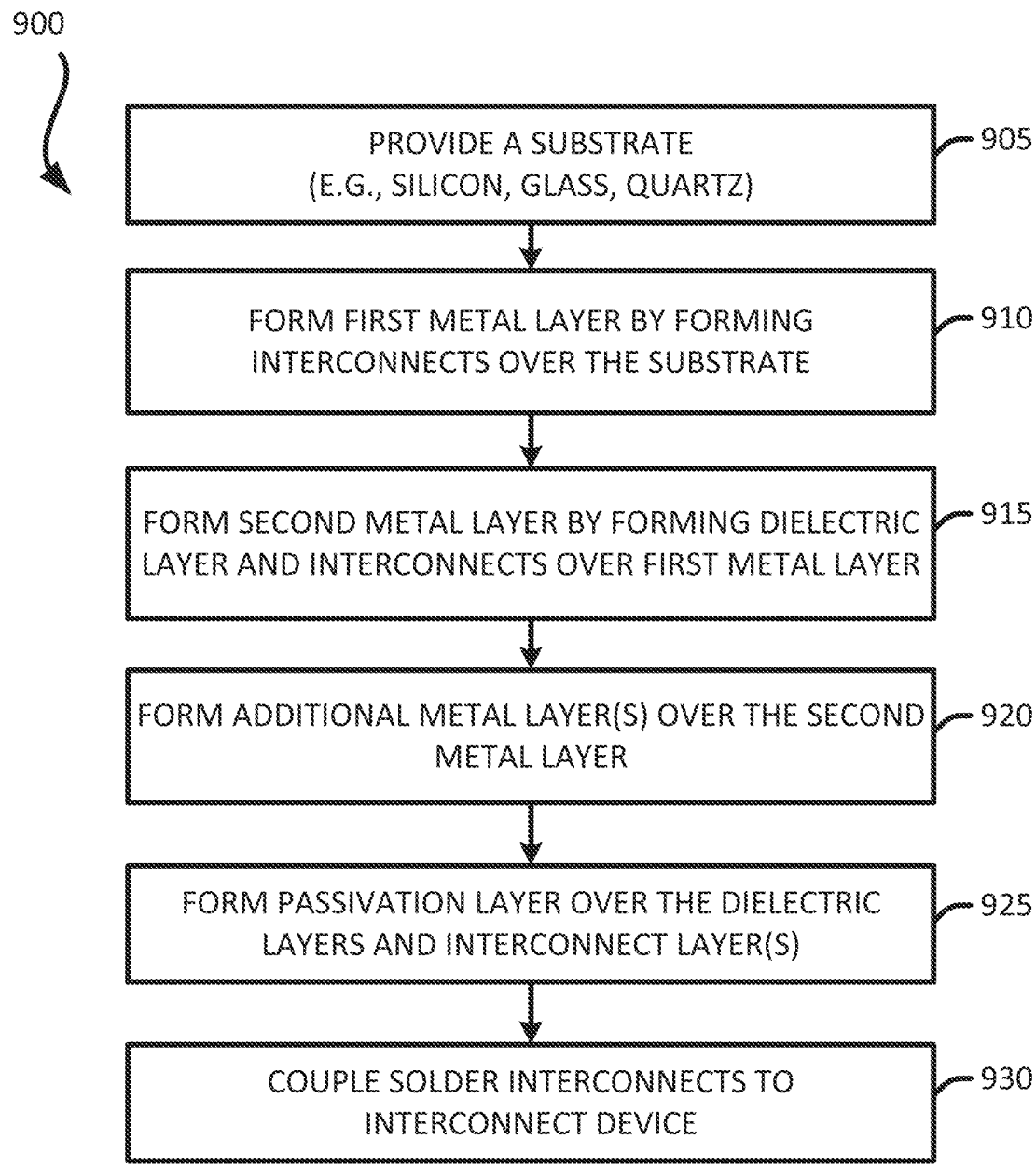
FIG. 9 illustrates an exemplary flow diagram of a method for fabricating an interconnect device.

In some implementations, fabricating a package that includes an interconnect device includes several processes. FIG. 9 illustrates an exemplary flow diagram of a method 900 for providing or fabricating a high-density interconnect device. In some implementations, the method 900 of FIG. 9 may be used to provide or fabricate the high-density interconnect device (e.g., 201) of FIG. 3 described in the disclosure. However, the method 900 may be used to provide or fabricate any of the interconnect devices described in the disclosure.

It should be noted that the method of FIG. 9 may combine one or more processes in order to simplify and/or clarify the method for providing or fabricating an interconnect device.

In some implementations, the order of the processes may be changed or modified. FIG. 9 will be described in terms of fabricating redistribution interconnects. However, the method of FIG. 9 may be used to fabricate any type of interconnect.

The method provides (at 905) a substrate (e.g., 316). The substrate 316 may include glass, quartz and/or silicon. Stage 1 of FIG. 8A illustrates and describes an example of a substrate.

The method forms (at 910) a first metal layer by forming a plurality of interconnects 822 over the substrate (e.g., 316). Forming the plurality of interconnects may include performing a lithography process, performing a plating process, performing a stripping process and/or performing an etching process. Stage 2 of FIG. 8A, illustrates and describes an example of forming a first metal layer for an interconnect device.

The method forms (at 915) a second metal layer by forming a dielectric layer (e.g., 830) and a plurality of interconnects 832 over the first metal layer. The dielectric layer may include a polymer. Forming the dielectric layer and the plurality of interconnects may include disposing a dielectric layer 830 over the dielectric layer 820 and the interconnects 822, performing a lithography process, performing a plating process, performing a stripping process and/or performing an etching process. Stages 3-5 of FIGS. 8A-8B, illustrate and describe an example of forming a second metal layer (e.g., redistribution layer, redistribution metal layer) for an interconnect device. A redistribution layer (RDL) may be a form of a metallization layer. An RDL may include interconnects that include a U-shape or V-shape. The terms "U-shape" and "V-shape" shall be interchangeable. The terms "U-shape" and "V-shape" may refer to the side profile shape of the interconnects and/or redistribution interconnects. The U-shape interconnect and the V-shape interconnect may have a top portion and a bottom portion. A bottom portion of a U-shape interconnect (or a V-shape interconnect) may be coupled to a top portion of another U-shape interconnect (or a V-shape interconnect). Forming the metal layer and the dielectric layer may include using a back end of line (BEOL) process.

The method forms (at 920) additional metal layer(s) by forming one or more dielectric layers (e.g., 840, 850) and a plurality of interconnects (e.g., 842, 852) over the second metal layer. The dielectric layer may include a polymer. Forming the dielectric layer and the plurality of interconnects may include disposing one or more dielectric layers (e.g., 840, 850) over the dielectric layer 830 and the interconnects 832, performing a lithography process, performing a plating process, performing a stripping process and/or performing an etching process. Stages 7-11 of FIGS. 8B-8C, illustrate and describe an example of forming additional metal layers for an interconnect device. Forming the additional metal layers and the additional dielectric layers may include using a back end of line (BEOL) process.

The method forms (at 925) a passivation layer (e.g., 314) over the dielectric layer of the interconnect device (e.g., 201). The passivation layer (e.g., 314) may be disposed over the dielectric layer 311. Stage 12 of FIG. 8D, illustrates and describes an example of a passivation layer formed over a dielectric layer of an interconnect device.

The method couples (at 930) a plurality of solder interconnects (e.g., 310) to the interconnect device (e.g., 201). Stage 13 of FIG. 8D may illustrate and describe an example of solder interconnects coupled to an interconnect device.

In some implementations, the interconnect device 201 is part of a wafer, and singulation may be performed to cut the wafer into individual interconnect devices. The method 900 may be used to fabricate an interconnect device 201 that includes the plurality of interconnects 312.

Exemplary Sequence for Fabricating a Substrate

In some implementations, fabricating a substrate includes several processes. FIGS. 10A-10C illustrate an exemplary sequence for providing or fabricating a substrate. In some implementations, the sequence of FIGS. 10A-10C may be used to provide or fabricate the substrate 202 of FIG. 3. However, the process of FIGS. 10A-10C may be used to fabricate any of the substrates described in the disclosure. For example, when the interconnect device 201 is implemented as a substrate and/or interposer, the process of FIGS. 10A-10C may be used to fabricate the interconnect device 201.

It should be noted that the sequence of FIGS. 10A-10C may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 10A, illustrates a state after a carrier 1000 is provided and a metal layer is formed over the carrier 1000. The metal layer may be patterned to form interconnects 1002. A plating process and etching process may be used to form the metal layer and interconnects.

Stage 2 illustrates a state after a dielectric layer 1020 is formed over the carrier 1000 and the interconnects 1002. The dielectric layer 1020 may include polyimide. However, different implementations may use different materials for the dielectric layer.

Stage 3 illustrates a state after a plurality of cavities 1010 is formed in the dielectric layer 1020. The plurality of cavities 1010 may be formed using an etching process (e.g., photo etching process) or laser process.

Stage 4 illustrates a state after interconnects 1012 are formed in and over the dielectric layer 1020. For example, a via, pad and/or traces may be formed. A plating process may be used to form the interconnects.

Stage 5 illustrates a state after another dielectric layer 1022 is formed over the dielectric layer 1020. The dielectric layer 1022 may be the same material as the dielectric layer 1020. However, different implementations may use different materials for the dielectric layer.

Stage 6, as shown in FIG. 10B, illustrates a state after a plurality of cavities 1030 is formed in the dielectric layer 1022. An etching process or laser process may be used to form the cavities 1030.

Stage 7 illustrates a state after interconnects 1014 are formed in and over the dielectric layer 1022. For example, via, pad and/or trace may be formed. A plating process may be used to form the interconnects.

Stage 8 illustrates a state after another dielectric layer 1024 is formed over the dielectric layer 1022. The dielectric layer 1024 may be the same material as the dielectric layer 1020. However, different implementations may use different materials for the dielectric layer.

Stage 9 illustrates a state after a plurality of cavities 1040 is formed in the dielectric layer 1024. An etching process or laser process may be used to form the cavities 1040.

Stage 10, as shown in FIG. 10C, illustrates a state after interconnects 1016 are formed in and over the dielectric layer 1024. For example, via, pad and/or trace may be formed. A plating process may be used to form the interconnects.

Some or all of the interconnects 1002, 1012, 1014 and/or 1016 may define the plurality of interconnects 322 of the substrate 202. The dielectric layers 1020, 1022, 1024 may be represented by the at least one dielectric layer 320.

Stage 11 illustrates a state after the carrier 1000 is decoupled (e.g., removed, grinded out) from the dielectric layer 320, leaving the substrate 202.

Stage 12 illustrates a state after the first solder resist layer 324 and the second solder resist layer 326 are formed over the substrate 202.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Exemplary Flow Diagram of a Method for Fabricating a Substrate

Figure 11:
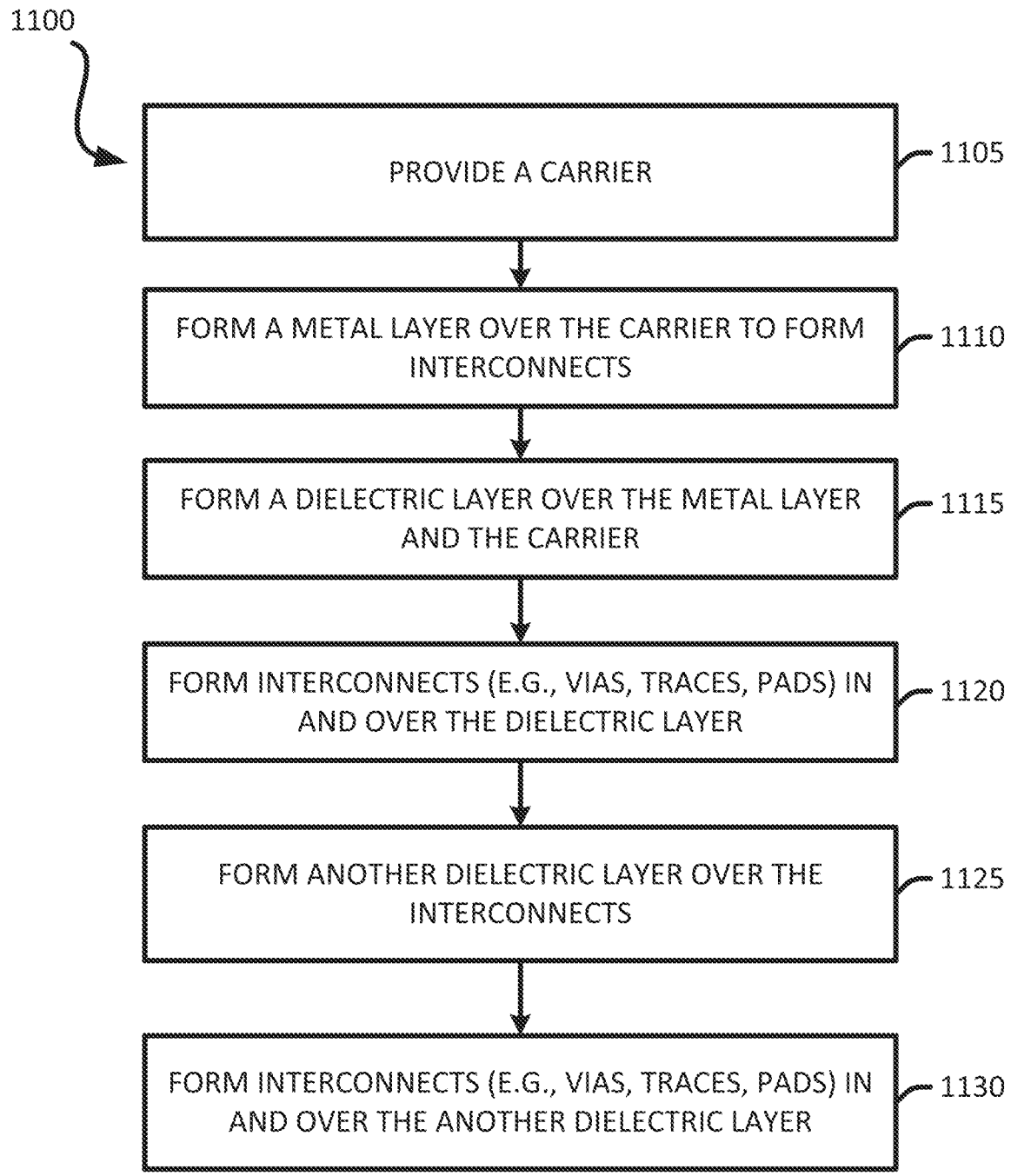
FIG. 11 illustrates an exemplary flow diagram of a method for fabricating a substrate.

In some implementations, fabricating a substrate includes several processes. FIG. 11 illustrates an exemplary flow diagram of a method 1100 for providing or fabricating a substrate. In some implementations, the method 1100 of FIG. 11 may be used to provide or fabricate the substrate of FIG. 3. For example, the method of FIG. 11 may be used to fabricate the substrate 202. The method of FIG. 11 may be used to fabricate the interconnect device, when the interconnect device is implemented as substrate and/or interposer.

It should be noted that the method of FIG. 11 may combine one or more processes in order to simplify and/or clarify the method for providing or fabricating a substrate. In some implementations, the order of the processes may be changed or modified.

The method provides (at 1105) a carrier 1000. Different implementations may use different materials for the carrier. The carrier may include a substrate, glass, quartz and/or carrier tape. Stage 1 of FIG. 10A illustrates and describes an example of a state after a carrier is provided.

The method forms (at 1110) a metal layer over the carrier 1000. The metal layer may be patterned to form interconnects. A plating process may be used to form the metal layer and interconnects. Stage 1 of FIG. 10A illustrates and describes an example of a state after a metal layer and interconnects 1002 are formed.

The method forms (at 1115) a dielectric layer 1020 over the carrier 1000 and the interconnects 1002. The dielectric layer 1020 may include polyimide. Forming the dielectric layer may also include forming a plurality of cavities (e.g., 1010) in the dielectric layer 1020. The plurality of cavities may be formed using an etching process (e.g., photo etching) or laser process. Stages 2-3 of FIG. 10A illustrate and describe an example of forming a dielectric layer and cavities in the dielectric layer.

The method forms (at 1120) interconnects in and over the dielectric layer. For example, the interconnects 1012 may be formed in and over the dielectric layer 1020. A plating process may be used to form the interconnects. Forming interconnects may include providing a patterned metal layer over and/or in the dielectric layer. Stage 4 of FIG. 10A illustrates and describes an example of forming interconnects in and over a dielectric layer.

The method forms (at 1125) a dielectric layer 1022 over the dielectric layer 1020 and the interconnects. The dielectric layer 1022 may include polyimide. Forming the dielectric layer may also include forming a plurality of cavities (e.g., 1030) in the dielectric layer 1022. The plurality of cavities may be formed using an etching process or laser process. Stages 5-6 of FIGS. 10A-10B illustrate forming a dielectric layer and cavities in the dielectric layer.

The method forms (at 1130) interconnects in and/or over the dielectric layer. For example, the interconnects 1014 may be formed. A plating process may be used to form the interconnects. Forming interconnects may include providing a patterned metal layer over an in the dielectric layer. Stage 7 of FIG. 10B illustrates and describes an example of forming interconnects in and over a dielectric layer.

The method may form additional dielectric layer(s) and additional interconnects as described at 1125 and 1130. Stages 8-10 of FIG. 10B-10C illustrate and describe an example of forming additional interconnects in and over a dielectric layer.

Once all the dielectric layer(s) and additional interconnects are formed, the method may decouple (e.g., remove, grind out) the carrier (e.g., 1000) from the dielectric layer 1020, leaving the substrate. In some implementations, the method may form solder resist layers (e.g., 324, 326) over the substrate.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Figure 12A:
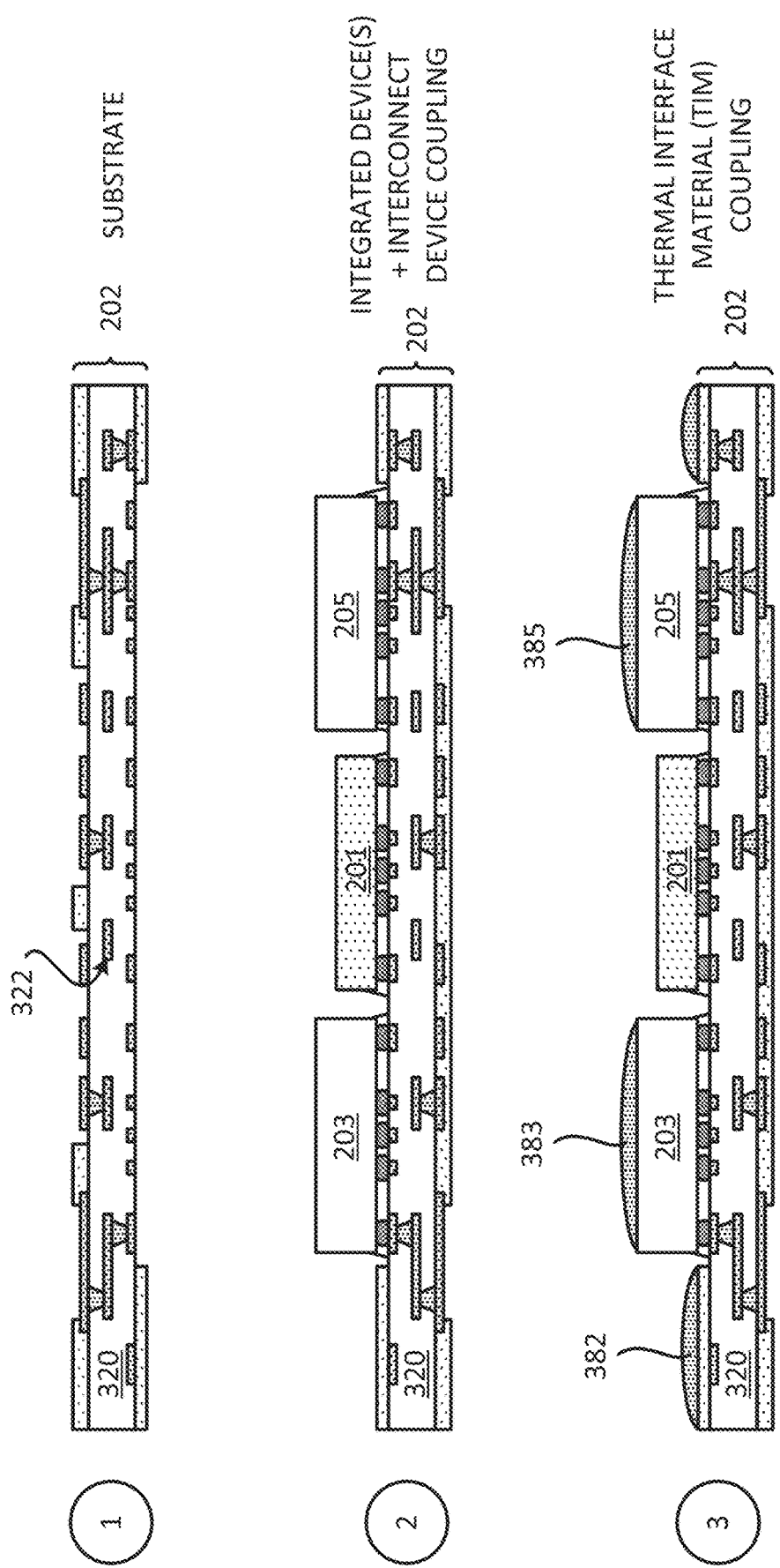
FIGS. 12A-12B illustrate an exemplary sequence for fabricating a package that includes an interconnect device coupled to a substrate.
Figure 12B:
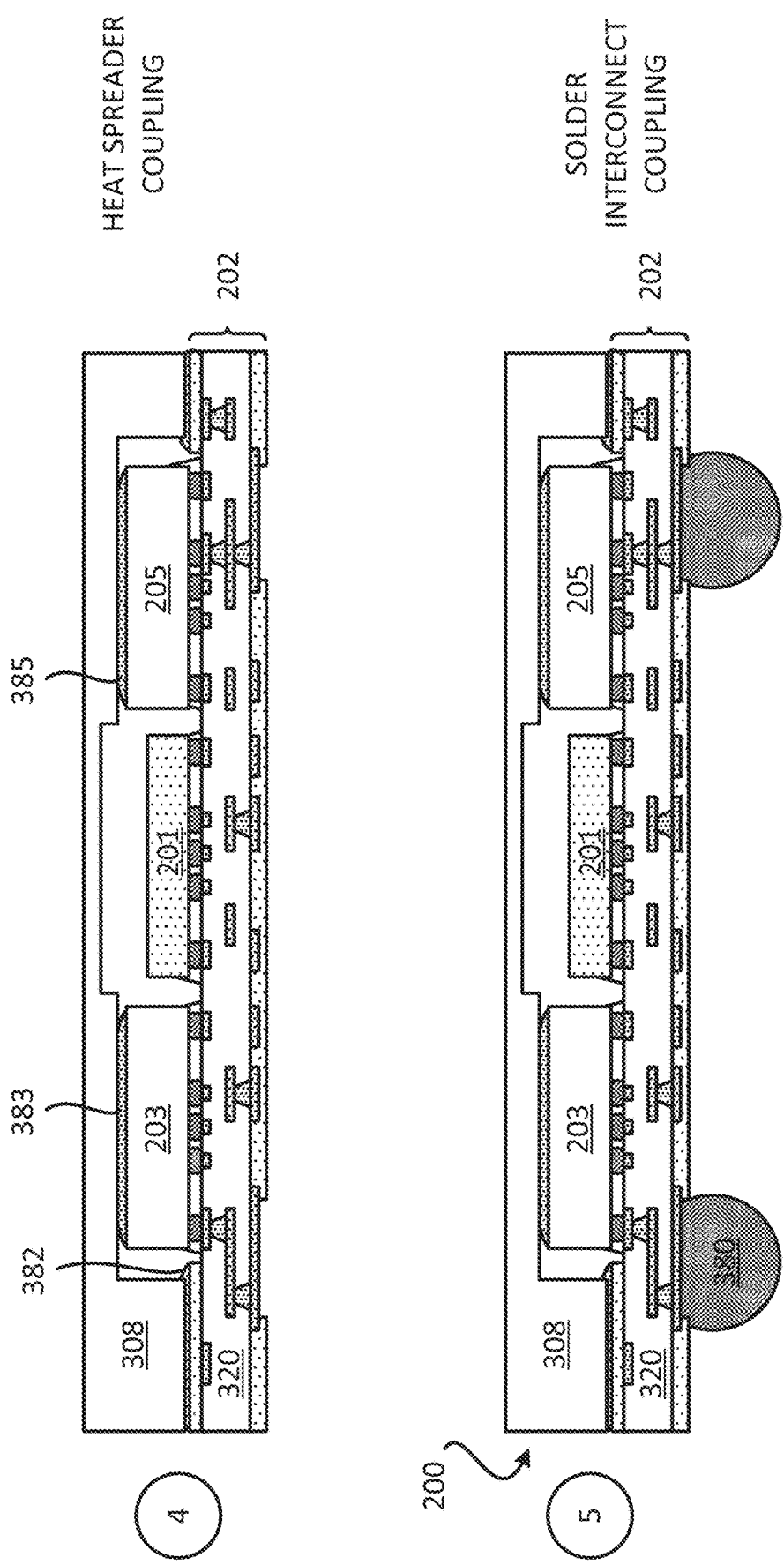

Exemplary Sequence for Fabricating a Package That Includes an Interconnect Device Coupled to a Substrate FIGS. 12A-12B illustrate an exemplary sequence for providing or fabricating a package that includes an interconnect device coupled to a substrate. In some implementations, the sequence of FIGS. 12A-12B may be used to provide or fabricate the package 200 that includes the substrate 202 and the interconnect device 201 of FIG. 3, or any of the packages described in the disclosure.

It should be noted that the sequence of FIGS. 12A-12B may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIGS. 12A-12B may be used to fabricate one package or several packages at a time (as part of a wafer).

Stage 1, as shown in FIG. 12A, illustrates a state after the substrate 202 is provided. The substrate 202 may be provided by a supplier or fabricated. A process similar to the process shown in FIGS. 10A-10C may be used to fabricate the substrate 202. However, different implementations may use different processes to fabricate the substrate 202. Examples of processes that may be used to fabricate the substrate 202 include a semi-additive process (SAP) and a modified semi-additive process (mSAP). The substrate 202 includes at least one dielectric layer 320, and a plurality of interconnects 322. The substrate 202 may be a laminate substrate, a coreless substrate, an organic substrate, a substrate that includes a core layer (e.g., cored substrate). In some implementations, the at least one dielectric layer 320 may include a core layer and/or prepreg layers.

Stage 2 illustrates a state after the integrated device 203, the integrated device 205 and the interconnect device 201 are coupled to a first surface (e.g., top surface) of the substrate 202. The integrated device 203 may be coupled to the substrate 202 through a plurality of solder interconnects 330. The integrated device 205 may be coupled to the substrate 202 through a plurality of solder interconnects 350. The interconnect device 201 may be coupled to the substrate 202 through a plurality of solder interconnects 310. Other integrated devices (e.g., 207, 209) may be coupled to the substrate 202. The integrated devices may be coupled to the substrate 202 such that the integrated device 207 is located in a second quadrant 212 of the substrate 202, the integrated device 205 is located in a first quadrant 211 of the substrate 202, the integrated device 203 is located in a third quadrant 213 of the substrate 202 and the integrated device 209 is located in a fourth quadrant 214 of the substrate 202, as described in FIG. 2.

Stage 3 illustrates a state after thermal interface material (TIMs) are provided over the substrate 202 and the integrated devices. For example, a TIM 382 may be deposited over the substrate 202, a TIM 383 may be deposited over a back side of the integrated device 203, and a TIM 385 may be deposited over a back side of the integrated device 205. Other TIMs may be deposited over other integrated devices coupled to the substrate 202.

Stage 4, as shown in FIG. 12B, illustrates a state after a heat spreader 308 is coupled to the substrate 202 and the integrated devices through the various TIMs. A pick and place process may be used to the heat spreader 308 to the substrate 202 and the integrated devices through the TIMs 382, 383 and 385. In some implementations, the TIMs 382, 383 and 385 may be part of the same TIM.

Stage 5 illustrates a state after the plurality of solder interconnects 380 is coupled to the second surface (e.g., bottom surface) of the substrate 202. The plurality of solder interconnects 380 may be coupled to interconnects from the plurality of interconnects 322 of the substrate 202. A solder reflow process may be used to couple the plurality of solder interconnects 380 to the substrate 202. Stage 5 may illustrate the package 200 as described in FIGS. 2-7. The packages (e.g., 200,) described in the disclosure may be fabricated one at a time or may be fabricated together as part of one or more wafers and then singulated into individual packages.

Figure 13:
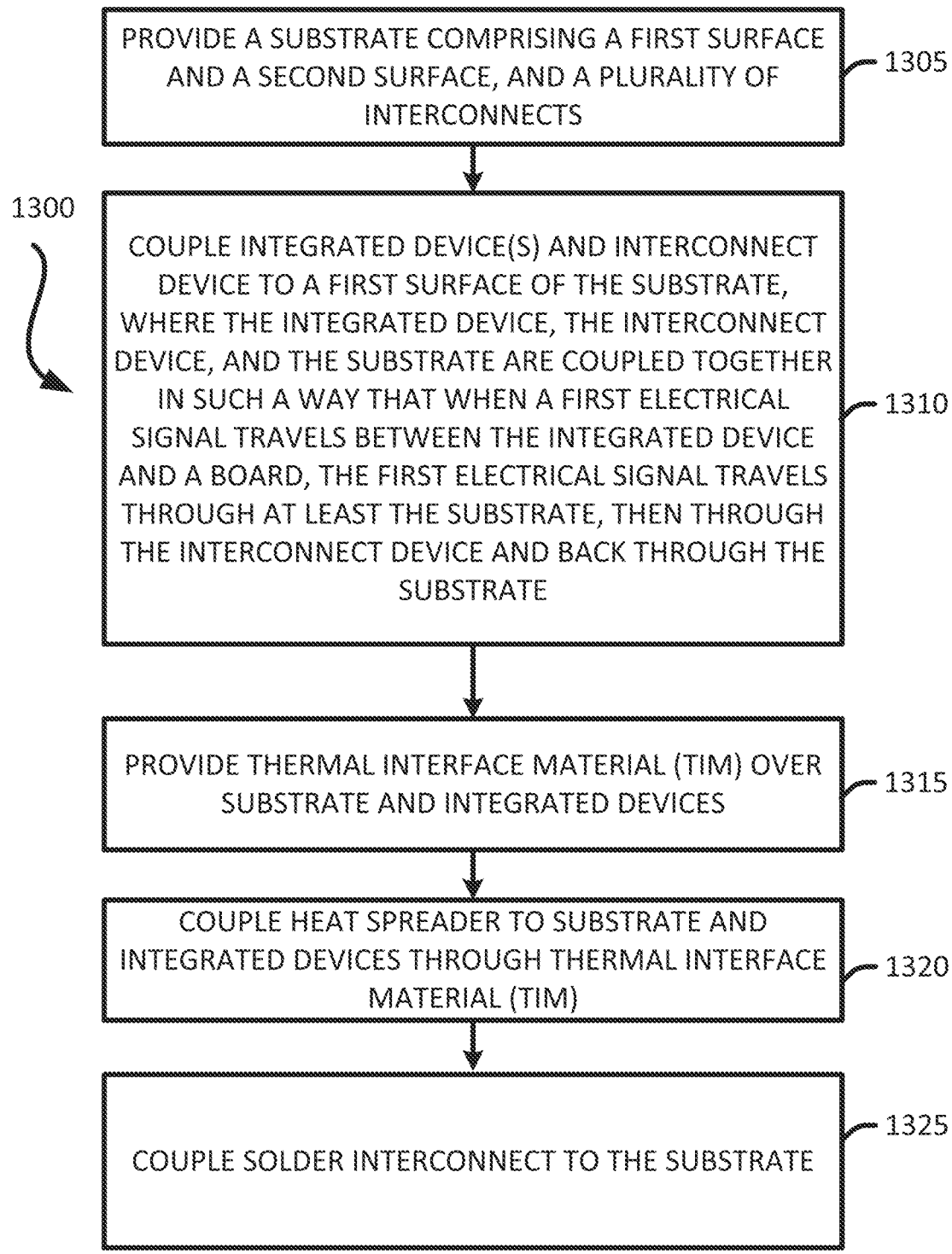
FIG. 13 illustrates an exemplary flow diagram of a method for fabricating a package that includes an interconnect device coupled to a substrate.

Exemplary Flow Diagram of a Method for Fabricating a Package That Includes an Interconnect Device Coupled to a Substrate In some implementations, fabricating a package that includes a high-density interconnect device coupled to a substrate includes several processes. FIG. 13 illustrates an exemplary flow diagram of a method 1300 for providing or fabricating a package that includes a high-density interconnect device coupled to a substrate. In some implementations, the method 1300 of FIG. 13 may be used to provide or fabricate the package 200 of FIG. 3 described in the disclosure. However, the method 1300 may be used to provide or fabricate any of the packages described in the disclosure.

It should be noted that the method of FIG. 13 may combine one or more processes in order to simplify and/or clarify the method for providing or fabricating a package that includes a high-density interconnect device coupled to a substrate. In some implementations, the order of the processes may be changed or modified.

The method provides (at 1305) a substrate (e.g., 202). The substrate 202 may be provided by a supplier or fabricated. The substrate 202 includes a first surface and a second surface. The substrate 202 includes at least one dielectric layer 320 and a plurality of interconnects 322. Different implementations may provide different substrates. A process similar to the process shown in FIGS. 10A-10C may be used to fabricate the substrate 202. However, different implementations may use different processes to fabricate the substrate 202. Stage 1 of FIG. 12A illustrates and describes an example of providing a substrate.

The method couples (at 1310) at least one integrated device (e.g., 203, 205) and an interconnect device (e.g., 201) to the first surface of the substrate (e.g., 202). The integrated device 203 may be coupled to the substrate 202 through the plurality of solder interconnects 330. The plurality of solder interconnects 330 may be coupled to interconnects from the plurality of interconnects 322 of the substrate 202. The integrated device 203 may be coupled to the substrate 202 such that the front side (e.g., active side) of the first integrated device 203 is facing the substrate 202. As an example, the integrated device 203 and the interconnect device 201 may be coupled to the substrate 202 so that the integrated device, the interconnect device, and the substrate are coupled together in such a way that when a first electrical signal travels between the integrated device and a board (e.g., 390), the first electrical signal travels through the substrate 202, then through the interconnect device 201 and back through the substrate 202. The electrical path of the first electrical signal may include at least one interconnect that extends diagonally. The substrate 202 may be flipped before integrated devices are coupled to the substrate 202.

The integrated device 205 may be coupled to the substrate 202 through the plurality of solder interconnects 350. The plurality of solder interconnects 350 may be coupled to interconnects from the plurality of interconnects 322 of the substrate 202. The integrated device 205 may be coupled to the substrate 202 such that the front side (e.g., active side) of the integrated device 205 is facing the substrate 202.

As an example, the first integrated device 203, the second integrated device 205, and the interconnect device 201 may be coupled to the substrate 202 so that the integrated device, the interconnect device, and the substrate are coupled together in such a way that when a first electrical signal travels between the first integrated device 203 and the second integrated device 205, the first electrical signal travels through the interconnect device 201. For example, a first electrical signal between the first integrated device 203 and the second integrated device 205, may travel through the substrate 202, then through the interconnect device 201 and back through the substrate 202. The electrical path of the first electrical signal may include at least one interconnect that extends diagonally. Stage 2 of FIG. 12A illustrates and describes an example of integrated devices and an interconnect device coupled to a substrate. Coupling the integrated device to the substrate may also include providing an underfill (e.g., 313, 333, 353) between a respective integrated device (e.g., 203, 205) and the substrate 202. Stage 2 of FIG. 12A illustrates and describes an example of an underfill being provided.

The method provides (at 1315) at least one thermal interface material (TIM) over the substrate and/or the integrated devices. For example, a TIM 382 may be deposited over the substrate 202, a TIM 383 may be deposited over a back side of the integrated device 203, and a TIM 385 may be deposited over a back side of the integrated device 205. Stage 3 of FIG. 12A illustrates and describes an example of providing TIM.

The method couples (at 1320) a heat spreader to the substrate and the integrated devices. For example, a pick and place process may be used to the heat spreader 308 to the substrate 202 and the integrated devices through the TIMs 382, 383 and 385. Stage 4 of FIG. 12B illustrates and describes an example of coupling a heat spreader to a substrate and integrated devices.

The method couples (at 1320) a plurality of solder interconnects (e.g., 380) to the second surface of the substrate (e.g., 202). Stage 5 of FIG. 12B, illustrates and describes an example of coupling solder interconnects to the substrate.

Exemplary Electronic Devices

Figure 14:
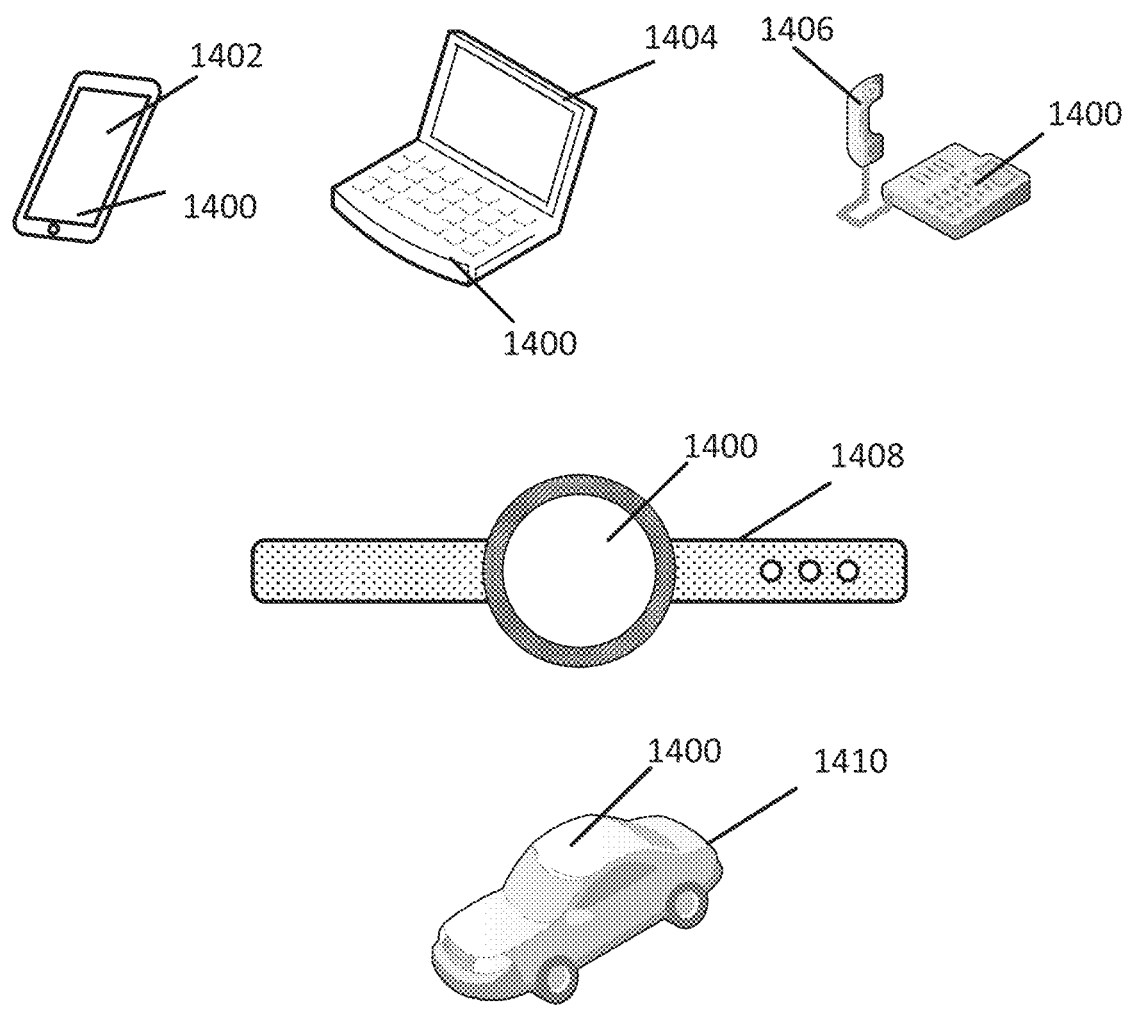
FIG. 14 illustrates various electronic devices that may integrate a die, an electronic circuit, an integrated device, an integrated passive device (IPD), a passive component, a package, and/or a device package described herein.

FIG. 14 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1402, a laptop computer device 1404, a fixed location terminal device 1406, a wearable device 1408, or automotive vehicle 1410 may include a device 1400 as described herein. The device 1400 may be, for example, any of the devices and/or integrated circuit (IC) packages described herein. The devices 1402, 1404, 1406 and 1408 and the vehicle 1410 illustrated in FIG. 14 are merely exemplary. Other electronic devices may also feature the device 1400 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-7, 8A-8D, 9, 10A-10C, 11, 12A-12B, and/or 13-14 may be rearranged and/or combined into a single component, process, feature or function or embodied in several components, processes, or functions. Additional elements, components, processes, and/or functions may also be added without departing from the disclosure. It should also be noted FIGS. 2-7, 8A-8D, 9, 10A-10C, 11, 12A-12B, and/or 13-14 and its corresponding description in the present disclosure is not limited to dies and/or ICs. In some implementations, FIGS. 2-7, 8A-8D, 9, 10A-10C, 11, 12A-12B, and/or 13-14 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit.

Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising a substrate comprising a plurality of interconnects; a first integrated device coupled to the substrate; a second integrated device coupled to the substrate; and an interconnect device coupled to the substrate, wherein the first integrated device, the second integrated device, the interconnect device and the substrate are configured to provide an electrical path for an electrical signal between the first integrated device and the second integrated device, that extends through at least the substrate, through the interconnect device and back through the substrate, and wherein the electrical path includes at least one interconnect that extends diagonally.

Aspect 2: The package of aspect 1, wherein the second integrated device is located diagonally to the first integrated device.

Aspect 3: The package of aspects 1 through 2, wherein the second integrated device is configured to be electrically coupled to the first integrated device through at least one interconnect that is diagonal relative to interconnects in the substrate.

Aspect 4: The package of aspects 1 through 3, wherein the interconnect device is coupled to the substrate at a rotated configuration relative to the first integrated device and the second integrated device.

Aspect 5: The package of aspects 1 through 4, wherein the interconnect device comprises: a first plurality of interconnects arranged in a first direction, wherein the first plurality of interconnects is configured to provide at least one electrical path between a first pair of integrated devices; and a second plurality of interconnects arranged in a second direction, wherein the second direction is orthogonal to the first direction, and wherein the second plurality of interconnects is configured to provide at least one electrical path between a second pair of integrated devices.

Aspect 6: The package of aspects 1 through 4, wherein the interconnect device comprises a first plurality of interconnects arranged in a Manhattan configuration that is configured to provide diagonal interconnects between the first integrated device and the second integrated device.

Aspect 7: The package of aspects 1 through 6, further comprising: a third integrated device coupled to the substrate, wherein the third integrated device is configured to be electrically coupled to the first integrated device through the substrate, and wherein the third integrated device is configured to be electrically coupled to the second integrated device through the substrate; a fourth integrated device coupled to the substrate, wherein the fourth integrated device is configured to be electrically coupled to the first integrated device through the substrate, and wherein the fourth integrated device is configured to be electrically coupled to the second integrated device through the substrate, wherein the second integrated device is coupled to a first quadrant of the substrate, wherein the third integrated device is coupled to a second quadrant of the substrate, wherein the first integrated device is coupled to a third quadrant of the substrate, and wherein the fourth integrated device is coupled to a fourth quadrant of the substrate.

Aspect 8: The package of aspects 1 through 7, wherein the interconnect device comprises a die substrate, at least one dielectric layer and a plurality of interconnects.

Aspect 9: The package of aspects 1 through 8, wherein the interconnect device includes a die that is free of a transistor.

Aspect 10: The package of aspects 1 through 7, wherein the interconnect device includes a bride substrate comprising at least one dielectric layer and a plurality of second interconnects.

Aspect 11: The package of aspects 1 through 10, wherein the interconnect device is configured as a bridge between the first integrated device and the second integrated device.

Aspect 12: The package of aspects 1 through 11, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 13: An apparatus comprising: a substrate comprising a plurality of interconnects; a first integrated device coupled to the substrate; a second integrated device coupled to the substrate; and means for device interconnection coupled to the substrate, wherein the first integrated device, the second integrated device, means for device interconnection and the substrate are configured to provide an electrical path for an electrical signal between the first integrated device and the second integrated device, that extends through at least the substrate, through the means for device interconnection and back through the substrate, and wherein the electrical path includes at least one interconnect that extends diagonally.

Aspect 14: The apparatus of aspect 13, wherein the second integrated device is configured to be electrically coupled to the first integrated device through at least one interconnect that is diagonal relative to interconnects in the substrate.

Aspect 15: The apparatus of aspects 13 through 14, wherein the means for device interconnection is coupled to the substrate at a rotated configuration relative to the first integrated device and the second integrated device.

Aspect 16: The apparatus of aspects 13 through 15, wherein the means for device interconnection includes a first plurality of interconnects that are arranged in a Manhattan configuration.

Aspect 17: The apparatus of aspects 13 through 16, wherein the first plurality of interconnects arranged in a Manhattan configuration is configured to provide diagonal interconnects between the first integrated device and the second integrated device.

Aspect 18: The apparatus of aspects 13 through 17, further comprising a third integrated device coupled to the substrate, wherein the third integrated device is configured to be electrically coupled to the first integrated device through the substrate, and wherein the third integrated device is configured to be electrically coupled to the second integrated device through the substrate.

Aspect 19: The apparatus of aspects 13 through 18, wherein the means for device interconnection comprises a die substrate, at least one dielectric layer and a second plurality of interconnects.

Aspect 20: The apparatus of aspects 13 through 18, wherein the means for device interconnection is configured as a bridge substrate between the first integrated device and the second integrated device.

Aspect 21: A method for fabricating a package comprising: providing a substrate comprising a plurality of interconnects; coupling a first integrated device to the substrate; coupling a second integrated device to the substrate; and coupling an interconnect device to the substrate, wherein the first integrated device, the second integrated device, the interconnect device and the substrate are configured to provide an electrical path for an electrical signal between the first integrated device and the second integrated device, that extends through at least the substrate, through the interconnect device and back through the substrate, and wherein the electrical path includes at least one interconnect that extends diagonally.

Aspect 22: The method of aspect 21, wherein the second integrated device is configured to be electrically coupled to the first integrated device through at least one interconnect that is diagonal.

Aspect 23: The method of aspects 21 through 22, wherein the interconnect device is coupled to the substrate at a rotated configuration relative to the first integrated device and the second integrated device.

Aspect 24: The method of aspects 21 through 23, wherein the interconnect device includes a first plurality of interconnects that is arranged in a Manhattan configuration.

Aspect 25: The method of aspects 21 through 24, wherein the first plurality of interconnects arranged in the Manhattan configuration is configured to provide diagonal interconnects between the first integrated device and the second integrated device.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
   a substrate comprising at least one dielectric layer and a plurality of interconnects;
   a first integrated device coupled to a first surface of the substrate;
   a second integrated device coupled to the first surface of the substrate; and
   an interconnect device coupled to the first surface of the substrate through a plurality of solder interconnects such that the plurality of solder interconnects are located between the interconnect device and the substrate,
   wherein the first integrated device, the second integrated device, the interconnect device and the substrate are configured to provide an electrical path for an electrical signal between the first integrated device and the second integrated device, that extends through at least the substrate, through at least a first solder interconnect from the plurality of solder interconnects, through the interconnect device, through at least a second solder interconnect from the plurality of solder interconnects, and back through the substrate, and
   wherein the electrical path includes at least one interconnect that extends diagonally.

2. The package of claim 1, wherein the second integrated device is located diagonally to the first integrated device.

3. The package of claim 1, wherein the second integrated device is configured to be electrically coupled to the first integrated device through at least one interconnect that is diagonal relative to interconnects in the substrate.

4. The package of claim 1, wherein the interconnect device is coupled to the substrate at a rotated configuration relative to the first integrated device and the second integrated device.

5. The package of claim 1, wherein the interconnect device comprises:
   a first plurality of interconnects arranged in a first direction, wherein the first plurality of interconnects is configured to provide at least one electrical path between a first pair of integrated devices; and
   a second plurality of interconnects arranged in a second direction,
   wherein the second direction is orthogonal to the first direction, and
   wherein the second plurality of interconnects is configured to provide at least one electrical path between a second pair of integrated devices.

6. The package of claim 1, wherein the interconnect device comprises a first plurality of interconnects arranged in a Manhattan configuration that is configured to provide diagonal interconnects between the first integrated device and the second integrated device.

7. The package of claim 1, further comprising:
   a third integrated device coupled to the substrate,
      wherein the third integrated device is configured to be electrically coupled to the first integrated device through the substrate, and
      wherein the third integrated device is configured to be electrically coupled to the second integrated device through the substrate;
   a fourth integrated device coupled to the substrate,
      wherein the fourth integrated device is configured to be electrically coupled to the first integrated device through the substrate, and
      wherein the fourth integrated device is configured to be electrically coupled to the second integrated device through the substrate,
   wherein the second integrated device is coupled to a first quadrant of the substrate,
   wherein the third integrated device is coupled to a second quadrant of the substrate,
   wherein the first integrated device is coupled to a third quadrant of the substrate, and
   wherein the fourth integrated device is coupled to a fourth quadrant of the substrate.

8. The package of claim 1,
   wherein the interconnect device comprises a die substrate, at least one first dielectric layer and a first plurality of interconnects,
   wherein the interconnect device comprises a front side and a back side, and
   wherein the interconnect device is coupled to the substrate such that the front side of the interconnect device faces the substrate.

9. The package of claim 1, wherein the interconnect device includes a die that is free of a transistor.

10. The package of claim 1,
wherein the interconnect device includes a bridge substrate comprising at least one first dielectric layer and a second plurality of interconnects,
wherein the interconnect device comprises a front side and a back side,
wherein the back side of the interconnect device includes the bridge substrate,
wherein the interconnect device is coupled to the substrate such that the back side of the interconnect device faces away from the substrate, and
wherein the electrical path for the electrical signal between the first integrated device and the second integrated device, enters and exits through the front side of the interconnect device.

11. The package of claim 1, wherein the interconnect device is configured as a bridge between the first integrated device and the second integrated device.

12. The package of claim 1, wherein the package is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

13. An apparatus comprising:
a substrate comprising at least one dielectric layer and a plurality of interconnects;
a first integrated device coupled to a first surface of the substrate;
a second integrated device coupled to the first surface of the substrate; and
means for device interconnection coupled to the first surface of the substrate through a plurality of solder interconnects such that the plurality of solder interconnects are located between the means for device interconnection and the substrate,
wherein the first integrated device, the second integrated device, means for device interconnection and the substrate are configured to provide an electrical path for an electrical signal between the first integrated device and the second integrated device, that extends through at least the substrate, through at least a first solder interconnect from the plurality of solder interconnects, through the means for device interconnection, through at least a second solder interconnect from the plurality of solder interconnects, and back through the substrate, and
wherein the electrical path includes at least one interconnect that extends diagonally.

14. The apparatus of claim 13, wherein the second integrated device is configured to be electrically coupled to the first integrated device through at least one interconnect that is diagonal relative to interconnects in the substrate.

15. The apparatus of claim 13, wherein the means for device interconnection is coupled to the substrate at a rotated configuration relative to the first integrated device and the second integrated device.

16. The apparatus of claim 13, wherein the means for device interconnection includes a first plurality of interconnects that is arranged in a Manhattan configuration.

17. The apparatus of claim 16, wherein the first plurality of interconnects arranged in the Manhattan configuration is configured to provide diagonal interconnects between the first integrated device and the second integrated device.

18. The apparatus of claim 13, further comprising a third integrated device coupled to the substrate,
wherein the third integrated device is configured to be electrically coupled to the first integrated device through the substrate, and
wherein the third integrated device is configured to be electrically coupled to the second integrated device through the substrate.

19. The apparatus of claim 13,
wherein the means for device interconnection comprises a die substrate, at least one dielectric layer and a second plurality of interconnects,
wherein the means for device interconnection comprises a front side and a back side, and
wherein the means for device interconnection is coupled to the substrate such that the front side of the means for device interconnection faces the substrate and the back side of the means for device interconnection faces away from the substrate.

20. The apparatus of claim 13, wherein the means for device interconnection is configured as a bridge substrate between the first integrated device and the second integrated device.

21. A method for fabricating a package comprising:
providing a substrate comprising at least one dielectric layer and a plurality of interconnects;
coupling a first integrated device to a first surface of the substrate;
coupling a second integrated device to the first surface of the substrate; and
coupling an interconnect device to the first surface of the substrate through a plurality of solder interconnects such that the plurality of solder interconnects are located between the interconnect device and the substrate,
wherein the first integrated device, the second integrated device, the interconnect device and the substrate are configured to provide an electrical path for an electrical signal between the first integrated device and the second integrated device, that extends through at least the substrate, through at least a first solder interconnect from the plurality of solder interconnects, through the interconnect device, through at least a second solder interconnect from the plurality of solder interconnects, and back through the substrate, and
wherein the electrical path includes at least one interconnect that extends diagonally.

22. The method of claim 21, wherein the second integrated device is configured to be electrically coupled to the first integrated device through at least one interconnect that is diagonal.

23. The method of claim 21, wherein the interconnect device is coupled to the substrate at a rotated configuration relative to the first integrated device and the second integrated device.

24. The method of claim 21, wherein the interconnect device includes a first plurality of interconnects that is arranged in a Manhattan configuration.

25. The method of claim 24, wherein the first plurality of interconnects arranged in the Manhattan configuration is configured to provide diagonal interconnects between the first integrated device and the second integrated device.

* * * * *